(12) United States Patent
Raman et al.

(10) Patent No.: US 10,148,237 B2
(45) Date of Patent: Dec. 4, 2018

(54) LOW NOISE AMPLIFIER CIRCUIT

(71) Applicant: Melexis Technologies SA, Bevaix (CH)

(72) Inventors: Johan Raman, Knesselare (BE); Pieter Rombouts, Mariakerke (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 15/402,502

(22) Filed: Jan. 10, 2017

(65) Prior Publication Data

US 2017/0207761 A1 Jul. 20, 2017

(30) Foreign Application Priority Data

Jan. 15, 2016 (GB) .................................. 1600774

(51) Int. Cl.
| | |
|---|---|
| *H03F 3/387* | (2006.01) |
| *H03F 3/45* | (2006.01) |
| *H03F 3/00* | (2006.01) |
| *H03F 3/393* | (2006.01) |
| *G01C 17/28* | (2006.01) |
| *G01D 5/14* | (2006.01) |
| *G01R 33/07* | (2006.01) |

(52) U.S. Cl.
CPC ......... *H03F 3/45475* (2013.01); *G01C 17/28* (2013.01); *G01D 5/142* (2013.01); *G01R 33/07* (2013.01); *H03F 3/005* (2013.01); *H03F 3/387* (2013.01); *H03F 3/393* (2013.01); *H03F 3/45098* (2013.01); *H03F 3/45197* (2013.01); *H03F 2200/129* (2013.01); *H03F 2200/135* (2013.01); *H03F 2200/156* (2013.01); *H03F 2200/171* (2013.01); *H03F 2200/261* (2013.01);
(Continued)

(58) Field of Classification Search
CPC ...... H03F 3/45475; G01C 17/28; G01D 5/142
See application file for complete search history.

(56) References Cited

U.S. PATENT DOCUMENTS

| 7,535,295 B1* | 5/2009 | Huijsing | .................. H03F 1/26 327/124 |
|---|---|---|---|
| 2013/0088294 A1* | 4/2013 | Heineman | ................. H03F 1/26 330/207 A |
| 2017/0111018 A1* | 4/2017 | Horiuchi | ............. H03F 3/45636 |

OTHER PUBLICATIONS

Enz et al., "Circuit Techniques for Reducing the Effects of Op-Amp Imperfections: Autozeroing, Correlated Double Sampling, and Chopper Stabilization", Proceedings of the IEEE, vol. 84, No. 11, Nov. 1996, pp. 1584-1614.

(Continued)

*Primary Examiner* — Jermele M Hollington
*Assistant Examiner* — Feba Pothen
(74) *Attorney, Agent, or Firm* — Workman Nydegger

(57) ABSTRACT

A semiconductor circuit comprising an input block having a first chopper providing a chopped voltage signal, a first transconductance converting said chopped voltage signal into a chopped current signal, a second chopper providing a demodulated current signal, a current integrator having an integrating capacitor providing a continuous-time signal, a first feedback path comprising: a sample-and-hold block and a first feedback block, the first feedback path providing a proportional feedback signal upstream of the current integrator. The amplification factor is at least 2. Charge stored on the integrating capacitor at the beginning of a sample period is linearly removed during one single sampling period. Each chopper operates at a chopping frequency. The sample-and-hold-block operates at a sampling frequency equal to an integer times the chopping frequency.

21 Claims, 21 Drawing Sheets

(52) U.S. Cl.
CPC .... *H03F 2200/264* (2013.01); *H03F 2200/27* (2013.01); *H03F 2200/271* (2013.01); *H03F 2200/294* (2013.01); *H03F 2200/312* (2013.01); *H03F 2200/321* (2013.01); *H03F 2200/372* (2013.01); *H03F 2200/375* (2013.01); *H03F 2200/81* (2013.01); *H03F 2203/45288* (2013.01); *H03F 2203/45472* (2013.01); *H03F 2203/45496* (2013.01); *H03F 2203/45512* (2013.01); *H03F 2203/45514* (2013.01); *H03F 2203/45528* (2013.01); *H03F 2203/45536* (2013.01); *H03F 2203/45552* (2013.01); *H03F 2203/45564* (2013.01); *H03F 2203/45594* (2013.01); *H03F 2203/45596* (2013.01)

(56) References Cited

OTHER PUBLICATIONS

Fan et al., "A 21 nV/√Hz Chopper-Stabilized Multi-Path Current-Feedback Instrumentation Amplifier with 2 μV Offset", IEEE Journal of Solid-State Circuits, vol. 47, No. 2, Feb. 2012, pp. 464-475.

Great Britain Search Report from GB Application No. GB1600774.2, dated Jul. 7, 2016.

Seol et al., "Small-Area Low-Ripple Chopper Instrumentation Amplifier Using Sample-and-Hold Circuit", Electronics Letters, vol. 49, No. 19, Sep. 12, 2013, pp. 1203-1205.

Tou et al., "Chapter 6: z-Transform Analysis", Digital and Sampled-data Control Systems, McGraw-Hill Book Company, Inc. 1959, pp. 214-230.

Bakker et al., "A CMOS Nested-Chopper Instrumentation Amplifier," IEEE Journal of Solid-State Sircuits, vol. 35, No. 12, Dec. 2000, pp. 1877-1883.

European Search Report from EP Application No. 17150596.9, dated Jun. 13, 2017.

Fan et al., "A 1.8 MW 60 nV/√Hz Capacitively-Coupled Chopper Instrumentation Amplifier in 65 nm CMOS for Wireless Sensor Nodes," IEEE Journal of Solid-State Circuits, vol. 46, No. 7, Jul. 2011, pp. 1534-1543.

Seol et al., "Small-Area Low-Ripple Chopper Instrumentation Amplifier Using Sample-and-Hold Circuit," Electronics Letters vol. 49, No. 19, Sep. 12, 2013, pp. 1203-1205.

Wu et al., "Dynamic Offset Cancellation Techniques for Operational Amplifiers," Precision Instrumentation Amplifiers and Read-Out Integrated Circuits, 2012, pp. 21-22.

\* cited by examiner

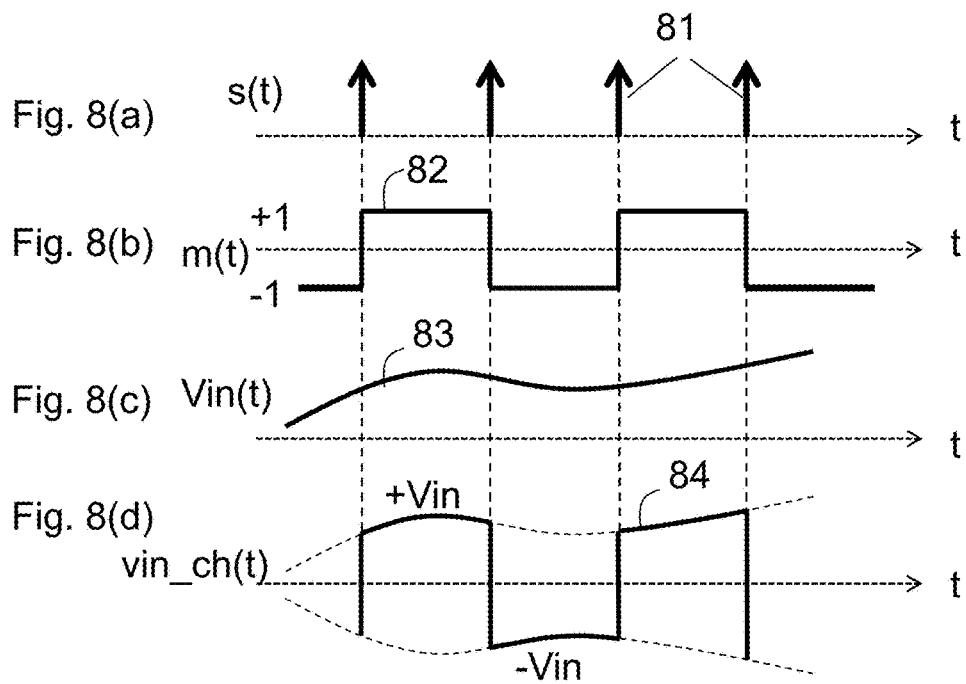
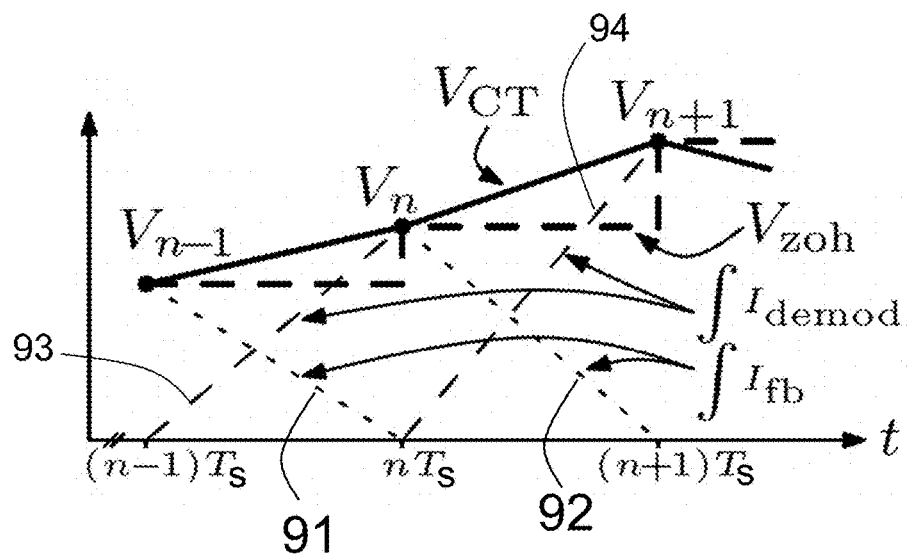
FIG 9

2300

2400

2500

2800

LOW NOISE AMPLIFIER CIRCUIT

FIELD OF THE INVENTION

The present invention relates in general to a low noise amplifier circuit. The present invention is particularly related to a semiconductor circuit comprising such an amplifier circuit, and to a sensor device comprising such an amplifier circuit.

BACKGROUND OF THE INVENTION

A large number of amplifier circuits are known in the art. Amplifier circuits are used for many different applications with many different requirements, for example in terms of electrical requirements/constraints: input level, output level, power consumption, heat dissipation, power efficiency, signal bandwidth, signal distortion, noise level, group delay, but also in terms of component cost, PCB size, etc.

Typically several requirements may conflict each other, and thus typically a trade-off needs to be made. There is no single ideal circuit topology which is best for all applications, but each type or class of amplifier has its own advantages and disadvantages.

The present invention is related to a new class of amplifier circuits with a high level of integration (in a semiconductor device), which is suitable for amplifying or pre-amplifying relatively small signals (e.g. having an amplitude less than 1 mV or even less than 100 µV) and provides good noise characteristics by incorporating chopper modulation (to avoid increased noise levels due to offset and flicker noise).

It is well known in the art, for example from C. Enz and G. C. Temes; "Circuit techniques for reducing the effects of op-amp imperfections: autozeroing, correlated double sampling, and chopper stabilization," Proc. IEEE, Vol. 84, No. 11, pp. 1584-1614, November 1996, further referred to herein as [Enz96], that chopping can be used to eliminating offset and flicker noise.

FIG. 1 shows an amplifier circuit presented by Q. Fan, J. H. Huij sing, and K A. A. Makinwa, "A 21 nV/sqrtHz chopper-stabilized multipath current-feedback instrumentation amplifier with 2 µV offset", IEEE ISSCC. Dig. Tech. Papers, pp. 80-81, February 2010. The circuit contains three choppers CH1, CH2, CH3, two transconductances Gin, Gfb, a current integrator Gint with an integrating capacitor Cint, and two resistors R1, R2 arranged as a voltage divider. The circuit transfer has an overall first order response (a single dominant pole).

There is always room for improvements or alternatives.

SUMMARY OF THE INVENTION

It is an object of embodiments of the present invention to provide an amplifier circuit or amplifier circuit topology that can be sized for low-noise amplification of an analog signal.

It is an object of particular embodiments of the present invention to provide an integrated sensor device comprising such an amplifier circuit.

It is an advantage of circuits and sensor devices according to the present invention that they provide an inherent noise-filtering characteristic which make them suitable for directly sampling without significant deterioration of the overall noise performance because of noise-folding.

It is an advantage of at least some circuits and sensor devices according to embodiments of the present invention that they may be used for amplifying various signals, including, but not limited to, biomedical signals and signals from a transducer element (e.g. in sensor applications).

It is an advantage of at least some circuits and sensor devices according to embodiments of the present invention that they are particularly suitable for co-integration with sampling-based circuits that post-process an/the amplified signal, such as e.g. with switched-capacitor circuits and/or with analog-to-digital conversion circuits.

These objectives are accomplished by embodiments of the present invention.

In a first aspect, the present invention provides a semiconductor circuit, comprising: an input block comprising a first chopper for providing a chopped input voltage signal indicative of a voltage signal to be amplified; a first transconductance arranged downstream of the first chopper and adapted for receiving a chopped voltage signal and adapted for converting said chopped voltage signal into a chopped current signal; a second chopper arranged downstream of the first transconductance adapted for providing a demodulated current signal; a current integrator arranged downstream of the second chopper, the current integrator comprising an integrating capacitor for storing an integrated signal and being adapted for providing a continuous-time signal; a first feedback path comprising a sample-and-hold block and a first feedback block, the sample-and-hold block being arranged downstream of the current integrator and being adapted for receiving the continuous-time signal and for sampling said signal using a sampling signal thereby providing a sampled signal, and for providing a zero-order-hold voltage signal proportional to said sampled signal; the first feedback block being arranged downstream of the sample-and-hold block, and being adapted for providing a first feedback signal proportional to the zero-order-hold signal according to a predefined proportionality factor, the first feedback signal being provided to the current integrator or to a component or to a node upstream of the current integrator; and wherein the components of the circuit are chosen such that an amplitude ratio of the continuous-time signal and the voltage signal to be amplified is at least 2.0; and wherein the first feedback block is adapted for providing the feedback signal such that, for a chopped input signal equal to zero, a charge stored on the integrating capacitor at the beginning of a sample period is linearly removed during one single sampling period of the sampling signal, in such a way that the charge is completely removed at the end of the single sampling period; and wherein each of the first and second chopper is adapted to be operated at a chopping frequency, and the sample-and-hold-block is adapted to be operated at a sampling frequency, wherein the sampling frequency is equal to the chopping frequency or equal to an integer times the chopping frequency, the integer being larger than zero.

It is an advantage of embodiments of the present invention that low-noise signal amplification is obtained. It is an advantage that the circuit of the present invention is at the same time an amplifier and also has a highly desirable filter effect. It is an advantage that an output of the circuit can be directly sampled without significant amount of excess noise due to noise folding (allowing sampling-based circuits to be directly connected to its output).

Although, at first sight, several "sub-circuits" and techniques used in this integrated circuit are known per se in the art, the specific combination and arrangement of elements as specified in the claim provides an amplifier circuit with a unique behavior in terms of "low-noise amplification", in particular related to broadband white noise. As far as is known to the inventors—the advantageous behavior of this circuit is unprecedented in the prior art, and it is the best possible behavior of its kind known thus far (as compared to any other amplifier circuit that includes chopping and has an overall first-order response).

It is an advantage that no dedicated analog filter is required for filtering, and/or that no additional current consumption is required for active filtering, and/or that no tuning of filter characteristics is required (due to lage tolerances).

The inventors are of the strong opinion that the specific combination of features is not trivial, inter alia because it is very uncommon to use a discrete-time feedback-loop in an otherwise continuous-time circuit, and because it is counter-intuitive to reduce noise by feedback of a sampled signal because of a widespread belief that sampling always increases noise levels due to noise folding.

The main benefit of the circuit in terms of noise performance can be best appreciated from the spectral graphs illustrated in FIG. 20. A prior art amplifier circuit with a first order filter characteristic adds an amount of noise power (due to folding of white noise) corresponding to the area under the curve 2001 in the noise-folding region f/fs>0.5, whereas embodiments of the present invention inadvertently add a significantly lower amount of noise, corresponding to the area under the curves 2002 and 2003 in the noise-folding region f/fs>0.5, depending on whether or not the circuit further comprises a second feedback loop (also referred to herein as "offset feedback loop").

It is an advantage of embodiments according to the present invention that a (relatively) large signal bandwidth (e.g. sensor bandwidth) and a (relatively) low latency can be obtained. The latency can be as small as only one or only two sampling periods Ts (where Ts=1/fs). The continuous-time output (Vct) has a latency smaller than one sampling period.

It is an advantage of embodiments of the present invention that the low-noise amplifier circuit works in continuous amplitude. This offers the advantage for applications that do not benefit from conversion to the digital domain, that no ADC and/or DAC or sigma-delta-modulator are needed, thus saving power and silicon area. It is a further advantage that no amplitude-quantization noise is introduced in the feedback-loop, resulting in a low overall noise behavior. Furthermore, the bandwidth of systems with an ADC, even with a sigma-delta ADC is typically severely limited by the ADC, for example because of an oversampling factor (typically at least a factor 8). As there is no ADC in the feedback path, the circuit of the present invention can exploit (almost) the full bandwidth.

It is an advantage of embodiments of the present invention that the circuit can optionally also provide a discrete-time voltage output signal.

It is a further advantage of using an integrator (in the forward path), comprising one or more active components (e.g. transistors or an OP-AMP or an OTA) that it provides a low-impedance output, which can be directly sampled e.g. for back-end processing, without requiring extra buffering.

It is an advantage that the overall noise-behavior of the entire circuit is mainly determined by the noise-behavior of the first transconductor, (also referred to herein as "low noise transconductance") and is much less sensitive to the noise-behavior of other components such as the current integrator or the feedback-transconductor.

It is an advantage that this circuit can be used to amplify DC-signals.

It is an advantage that one or more of the continuous-time continuous-amplitude analog signal (Vct), and/or the sampled signal (Vdt), and/or the zero-order-hold signal (Vzoh) can be provided as output signal(s).

It is an advantage that the ratio of the integrated signal and the voltage signal to be amplified, also known as the "overall gain" of the circuit, can be chosen to be a specific predefined value, for example equal to 2.0 or 5.0 or 10.0 or 100.0 or 1000.0.

It is an advantage of embodiments of the present invention that no active or passive analog low-pass filter such as e.g. an RC-filter or a Butterworth filter or Elliptic filter or Chebychev filter is required, but that the circuit itself provides a low-pass filter characteristic, while reducing, e.g. minimizing excess noise due to noise-folding.

It is an advantage of semiconductor circuits according to the present invention that they can be sized (during design-time) such that they are capable of amplifying a signal (e.g. a voltage signal) with a specific gain factor, while adding less noise due to noise-folding than a prior art amplifier circuit implemented in the same technology and offering the same gain and having an overall first-order response with the same (3 dB)-bandwidth.

It is an advantage of semiconductor circuits according to embodiments of the present invention that they may be used as an instrumentation amplifier, e.g. for providing a high input impedance, a large common-mode rejection ratio, and a definite gain.

In an embodiment, the first feedback path is arranged in one of the following ways: i) wherein the first feedback block comprises or is a second transconductance adapted for providing a current feedback signal which is fed back between an output of the second chopper and an input of the current integrator; ii) wherein the feedback block comprises or consists of a scaler for providing a voltage feedback signal, and the voltage feedback signal is fed back upstream of the first chopper; iii) wherein the feedback block comprises a second transconductance for providing a current feedback signal proportional to the zero-order-hold signal, and the current feedback signal is fed back upstream of the first chopper; iv) wherein the feedback block comprises a third chopper and second transconductance connected in series, for providing a chopped current feedback signal, the third chopper operable at the chopping frequency, and wherein the chopped current feedback signal is fed back between an output of the first transconductance and an input of the second chopper; v) wherein the feedback block comprises a third chopper and a second transconductance connected in series, for providing a chopped current feedback signal, the third chopper operable at the chopping frequency, and wherein the chopped current feedback signal is fed back to an internal node of the first transconductance; vi) wherein the feedback block comprises a third chopper and a scaler connected in series for providing a chopped voltage feedback signal, the third chopper operable at the chopping frequency, and the chopped voltage feedback signal is fed back between an output of the first chopper and an input of the first transconductance.

It is an advantage that the semiconductor circuit can be used with a wide variety of different input blocks.

In an embodiment, the sampling frequency (of the sample-and-hold block in the first feedback path) is twice the chopping frequency.

It is an advantage of circuits of the present invention that the useful bandwidth (defined by the 3 dB cutoff frequency) of the signal to be amplified, is about 88% of the Nyquist frequency, while introducing only about 30% of in-band power noise due to aliasing (of white noise).

It is an advantage of particular embodiments of the present invention wherein the sampling frequency is chosen equal to twice the chopping frequency (thus fs=2·fc) that the ratio fc/$f_{BW}$ can be as low as 1.14, i.e. the chopping frequency fc only has to be 14% higher than the bandwidth $f_{BW}$, which is particularly favorably in applications requiring a high bandwidth $f_{BW}$ but having practical constraints on the maximum possible chopper frequency.

In an embodiment, the sampling frequency (of the sample-and-hold block in the first feedback path) is equal to the chopping frequency.

In an embodiment wherein the sampling frequency (of the sample-and-hold block in the first feedback path) is twice the chopping frequency, the semiconductor circuit further comprises, if not already comprising, a third chopper arranged downstream of the current integrator and operable at the chopping frequency, and further comprising: a second feedback path for removing DC-offset and flicker noise, the second feedback path being adapted for providing a second feedback signal to the current integrator or to a component or to a node upstream of the current integrator, the second feedback path comprising: the third chopper, and a filter arranged downstream of the third chopper, the filter having a transfer function comprising at least one integration and a factor $(1+Z^{-1})$.

In an embodiment wherein the sampling frequency (of the sample-and-hold block in the first feedback path) is an integer N times the chopping frequency, the semiconductor circuit further comprises a second feedback path for removing DC-offset, the second feedback path being adapted for providing a second feedback signal to the current integrator or to a component or to a node upstream of the current integrator, the second feedback path comprising: a second sampler operable at a second sample frequency, and a fourth chopper arranged downstream of the second sampler, the fourth chopper operable at the chopping frequency, and a filter arranged downstream of the fourth chopper, the filter having a transfer function comprising at least one integration and a factor $(1+Z^{-1})$, and wherein the second sampling frequency is equal to twice the chopping frequency.

In both embodiments with a second feedback loop (as shown in FIG. 14 and FIG. 15), the feedback signal may for example be provided to the current integrator or to a component or node between the node where the chopped input signal Vin_ch is applied, and the second chopper CH2 or between said node and the current integrator CI1.

It is an advantage that the filter H3 comprises an integrator, which together with the choppers in the second feedback path provides a notch at the chopping frequency fc.

It is an advantage that the filter H3 comprises a factor $(1+Z^{-1})$ to block signal-related frequencies (which are up-converted by the fourth chopper CH4 to the chopping frequency fc) while amplifying offset-related frequencies, thus making the second feedback loop more selective.

It is a further advantage of the circuit with offset-suppressing feedback loop that it reduces DC-offset, and flicker noise. Such a circuit is ideally suited for readout of sensor-signals having also a DC-offset, such as for example Hall-sensors, while reducing or eliminating the risk of clipping the amplified signal to one of the power rails (VDD or GND).

It is a major advantage of embodiments comprising a second feedback path, in particular if fs and fc are chosen such that fs=1·fc or fs=2·fc, that the transfer function in the pass-band can be improved (substantially flat to a higher frequency), and that the transfer function has a very steep fall near the end of the pass-band.

In a second aspect, the present invention also relates to a semiconductor circuit, comprising: an input block comprising a first chopper adapted for providing a chopped input voltage signal indicative of a voltage signal to be amplified; at least one amplifier having an inverting input port and a non-inverting input port and an output port; and wherein either the output port of the first chopper is connected to the non-inverting input port of the at least one amplifier, or the non-inverting input port of the at least one amplifier is connected to a biasing voltage and the output port of the first chopper is connected to the inverting input port of the at least one amplifier via at least one intermediate component adapted for converting the chopped input voltage signal into a chopped current signal; a second chopper having an input port and an output port, the input port being connected to the output port of the at least one amplifier; a third chopper having an input port and an output port, the output port being connected to the inverting input port of the at least one amplifier; at least one integration capacitor connected between the output port of the second chopper and the input port of the third chopper; a sample and hold circuit having an input port connected to the output port of the at least one amplifier or to the output port of the second chopper, directly or through one or more intermediate components, and having an output port for providing a zero order hold voltage signal; a proportional feedback network having an input port connected directly or through one or more intermediate components to the output port of the sample and hold circuit, and being adapted for providing a proportional feedback signal, and having an output port connected directly or through one or more intermediate components to the inverting input port of the at least one amplifier; wherein a voltage of the at least one integration capacitor provides a continuous-time voltage signal being an amplified version of the voltage signal to be amplified; and wherein the values of the proportional feedback network are chosen such that an amplitude ratio of the continuous-time signal and the voltage signal to be amplified is at least 2.0; and wherein the value of the at least one integration capacitor is chosen such that, for a chopped input signal equal to zero, a charge stored on the integrating capacitor at the beginning of a sample period is linearly removed during one single sampling period of the sampling signal, in such a way that the charge is completely removed at the end of the single sampling period; and wherein each chopper is adapted to be operated at a chopping frequency, and the sample-and-hold-block is adapted to be operated at a sampling frequency, wherein the sampling frequency (fs) is equal to the chopping frequency (fc) or to an integer multiple (N) larger than zero thereof.

This embodiment describes a slightly different topology than the circuits described in the first aspect, but offer the same advantages, and is illustrated for example in FIGS. 26-28 and FIG. 31.

Many variants are possible. For example, the input signal may be a single-ended or a differential input signal. In case of a differential input signal, several components should be present in pairs, or should have dual input ports and output ports. The proportional feedback network may comprise or may be for example a resistive network or a transconductance, etc. Two specific embodiments are described next.

In an embodiment of a semiconductor circuit according to the second aspect, the input block is adapted for providing a differential chopped input voltage signal indicative of a differential voltage signal to be amplified; the at least one amplifier comprises: a first and a second Operational Transconductance Amplifier (OTA), the first OTA having a non-inverting input port connected to a first output of the first chopper and being adapted for providing a first output signal, the second OTA2 having a non-inverting input port connected to a second output of the first chopper different from the first output and being adapted for providing a second output signal; the second chopper being adapted for receiving the first respectively second output signal from the first respectively second OTA, the second chopper having a first output connected to a first node N1 and a second output connected to a second node N2; and wherein the at least one integrating capacitor comprises a first and a second integrating capacitor, the first integrating capacitor being arranged between the first node N1 and a third node N3, and the second integrating capacitor being arranged between the second node N2 and a fourth node N4; the third chopper having a first input connected to the third node N3 and a second input connected to the fourth node N4 and having a first output connected to the inverting input of the first OTA and having a second output connected to the inverting input of the second OTA; and wherein the resistive feedback network comprises: a first feedback resistor arranged between the third node N3 and a fifth node N5, and a second feedback resistor arranged between the fourth node N4 and a sixth node N6, and a third resistor arranged between the third node N3 and the fourth node N4; and wherein the sample and hold circuit has a first input connected to the first node N1 and a second input connected to the second node N2 and a first output connected to the fifth node N5 and a second output connected to the sixth node N6.

This specific embodiment is illustrated in FIG. 26 to FIG. 28.

In another embodiment of a semiconductor circuit according to the second aspect, the input block is adapted for receiving a differential voltage input signal to be amplified and for chopping said signal at a chopper frequency, a first output of the first chopper being connected to a base or gate of a first transistor or darlington-pair or the like, a second output of the first chopper being connected to a base or gate of a second transistor or darlington-pair or the like; and wherein the circuit further comprises a first and a second transistor or darlington-pair or the like, the first transistor or darlington-pair or the like having an emitter or a source connected through a first current source to ground, and having a collector or a drain connected through a second current source to a supply voltage, the second transistor or darlington-pair or the like having a source connected through a third current source to ground, and having a collector or drain connected through a fourth current source to a supply voltage; and wherein the at least one amplifier comprises: a first Operational Amplifier and a second Operational Amplifier, a non-inverting input of the first Operational Amplifier being connected to a biasing voltage and the non-inverting input of the second Operational Amplifier being connected to the biasing voltage; the sample-and-hold block having a first input connected to an output of the first Operational Amplifier, and having a second input connected to an output of the second Operational Amplifier, and having a first and second output connected via a resistor network to the emittor or source of the first transistor or darlington-pair or the like and to the emittor or source of the second transistor or darlington-pair or the like for providing a differential feedback signal; the second chopper having a first respectively second input connected to a first respectively second output of the first respectively second Operational Amplifier, and having a first respectively second output connected to a first respectively second output node, a potential difference between these nodes forming a differential output voltage as a continuous-time voltage signal being an amplified version of the differential input voltage; and wherein the at least one integrating capacitor comprises a first and a second integrating capacitor, the first integrating capacitor having one terminal connected to the first output node and another terminal connected to a first input of a third chopper, the second integrating capacitor having with one terminal connected to the second output node and another terminal connected to a second input of a third chopper; the third chopper having a first output connected to the collector or drain of the first transistor or darlington-pair or the like and connected to the inverting input of the first Operational Amplifier, and having a second output connected to the collector or drain of the second transistor or darlington-pair or the like and connected to the inverting input of the second Operational Amplifier.

This specific embodiment is illustrated in FIG. 31.

In an embodiment according to the first or second aspect, the input block is further adapted for receiving the voltage signal to be amplified from one or two external pins or from a voltage source inside the integrated circuit; or wherein the input block further comprises an impedance (e.g. resistance) or transimpedance (e.g. wheatstone-bridge) arranged upstream or downstream of the first chopper and is further adapted for receiving a continuous-time current signal from an external pin or from a current source inside the integrated circuit; or wherein the input block further comprises a transducer of the kind that converts a physical (e.g. non-electrical)signal or exitation into a voltage signal, the transducer being arranged upstream of the first chopper for providing the voltage signal to be amplified in response to the physical (e.g. non-electrical)signal or excitation; or wherein the input block further comprises a transducer of the kind that requires a biasing signal and provides a voltage signal indicative of a physical quantity, the transducer being arranged upstream of the first chopper for providing the voltage signal to be amplified in response to the physical quantity; or wherein the input block further comprises a transducer of the kind that requires a biasing signal and provides a voltage signal indicative of a physical quantity, the first chopper.

It is an advantage that the amplifier circuit according to embodiments of the present invention is very much suited for amplifying a signal from any of the above mentioned signal sources. In an embodiment according to the first or second aspect, at least all components downstream of the first chopper, including those of the first and/or second feedback path, are integrated on a single semiconductor die.

In a third aspect, the present invention provides a sensor device comprising: at least one sensor element or at least one transducer or at least one impedance or transimpedance for providing at least one voltage signal to be amplified; and a semiconductor circuit according to the first or second aspect, arranged for amplifying said at least one voltage signal.

The semiconductor circuit may be integrated on a first die, and the sensor element or transducer or impedance or transimpedance may be integrated on a second die. The first die and second die may be a single die. The first and second die may be two separate dies interconnected with each other but packaged in a single chip package.

In an embodiment, the sensor devices further comprises: an analog-to-digital convertor for converting the amplified voltage signal; and a digital processor for digitally processing the digitized signal.

The at least one transducer of the sensor may consist of a single Hall element or Hall sensor, or may comprise at least one Hall element or Hall sensor.

The sensor device may be comprise or may be a position sensor device or an electronic compass.

The circuit described above is ideally suited for amplifying voltage signals having an amplitude in the order of about 100 µV to about 10 mV, with low-noise. This makes the circuit ideally suited for amplifying a Hall voltage over a Hall plate, which low noise, in such applications as position sensors, in particular angular position sensors, or compass applications.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

In FIG. 2, the voltage to be amplified comes from an input pin or from a pad. The circuit comprises inter alia a first chopper.

In FIG. 3 the voltage signal to be amplified comes from a voltage source.

In FIG. 4, the voltage signal to be amplified is generated by a current source connected to an impedance, e.g. an electrical resistance. The first chopper is located downstream of the impedance (as seen from the signal source).

In FIG. 5, which is a variant of FIG. 6, the first chopper is located upstream of the impedance.

In FIG. 6, the input block contains a transducer for converting a pressure or pressure difference into a differential voltage signal. The transducer is biased by a biasing voltage which may be considered part of the input block (or not). The first chopper may be located upstream or downstream of the transducer.

In FIG. 7, the input block contains a transducer for converting a magnetic field into an electrical signal, in particular a Hall element. The transducer is biased by a biasing voltage or biasing current which may be considered part of the input block (or not). The first chopper may be located upstream or downstream of the transducer.

FIG. 8(a) and FIG. 8(b) show an exemplary (ideal) sampling signal s(t) and an exemplary chopping signal m(t) as can be used in embodiments of the present invention.

FIG. 8(c) shows an exemplary (single ended) voltage signal to be amplified.

FIG. 8(d) shows the signal of FIG. 8(c) after being chopped with the chopping signal of FIG. 8(b).

FIG. 9 is used to explain how the first feedback loop works in the circuit of FIG. 2, in particular how the proportional feedback signal erases the charge stored on the integrating capacitor after one single sampling period Ts=1/fs, and how the integrator provides an output signal Vct as a continuous-time continuous-amplitude signal traversing the time-discrete but continuous-amplitude samples Vn−1, Vn, etc.

In FIG. 10 the first feedback signal is provided to a current summing node located between the first transconductance and the second chopper.

In FIG. 11 the first feedback signal is provided to an internal node of the first transconductance.

In FIG. 12 the first feedback signal is provided to a voltage summing node located between the first chopper and the first transconductance.

In FIG. 13 the first feedback signal is provided to a voltage summing node located upstream of the first chopper.

The ratio of the sampling frequency fs and the chopping frequency fc in all embodiments shown in FIG. 2 to FIG. 7 and FIG. 10 to FIG. 13 is an integer number larger than zero, e.g. N=fs/fc=1, or 2, or 3, etc. In preferred embodiments the ratio N=fs/fc=1 or 2.

Figure 10:
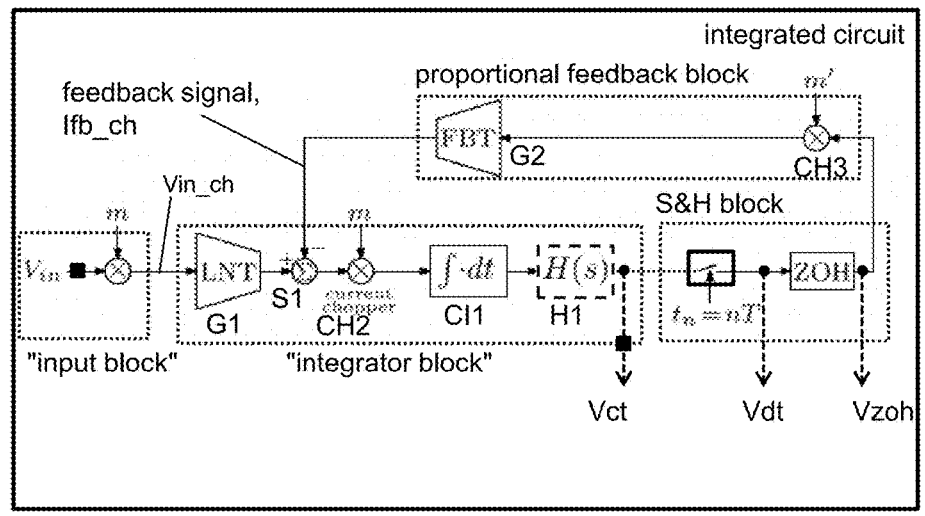
FIG. 10 to FIG. 13 show a second set of variants of FIG. 2, as embodiments of the present invention, illustrating different variants of the first feedback path.
Figure 14:
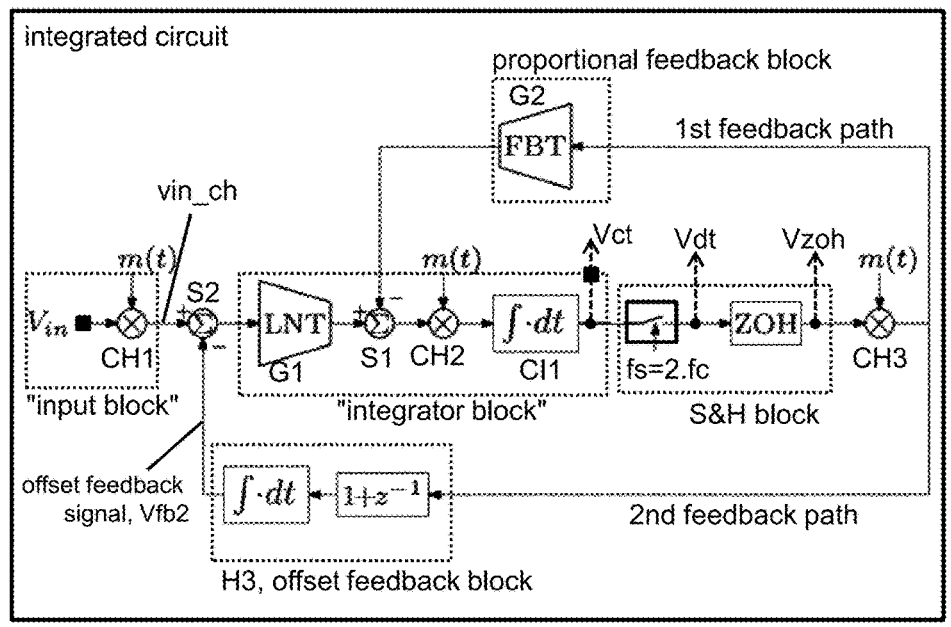

FIG. 14 is a variant of the embodiment of FIG. 10, further comprising a second feedback loop for DC-offset compensation. The sampler and third chopper is common to both the first feedback path and in the second feedback path. The ratio of the sampling frequency fs and the chopping frequency fc in this embodiment is 2.

Figure 15:
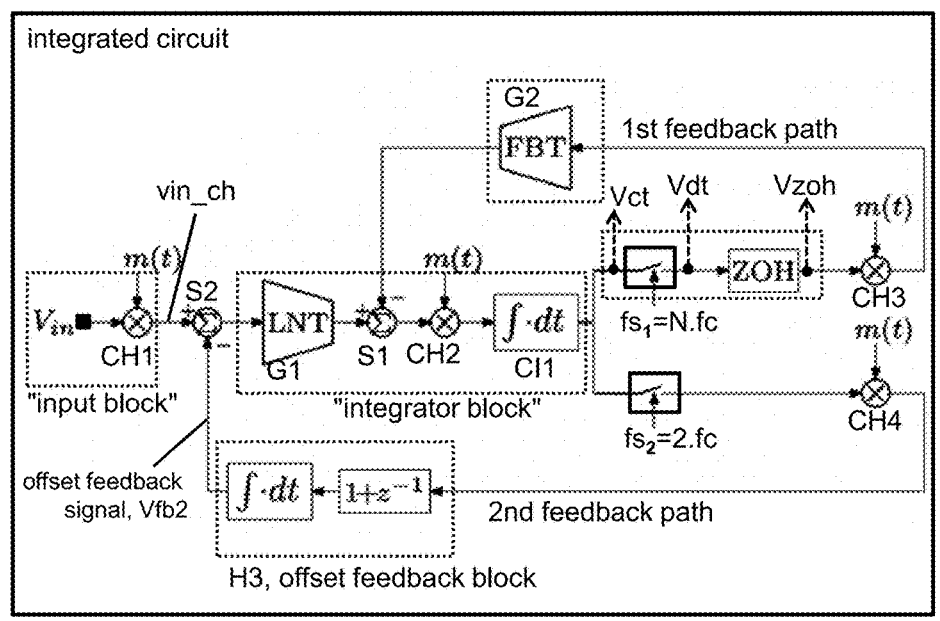

FIG. 15 shows a variant of the embodiment of FIG. 14, and has a forward path with a first and second chopper operating at chopping frequency fc, a first feedback path with a first sampler operating at a first sampling frequency $fs_1$ equal to an integer N times the chopping frequency fc (i.e. $fs_1$=N·fc, with N an integer larger than 0, preferably 1 or 2) and a third chopper operating at the chopping frequency fc, and a second feedback path with a second sampler operating at a second sampling frequency $fs_2$ equal to twice the chopping frequency fc (i.e. $fs_2$=2·fc) and a fourth chopper operating at chopping frequency fc and optional suitable delay of the chopping signal m.

Figure 16:
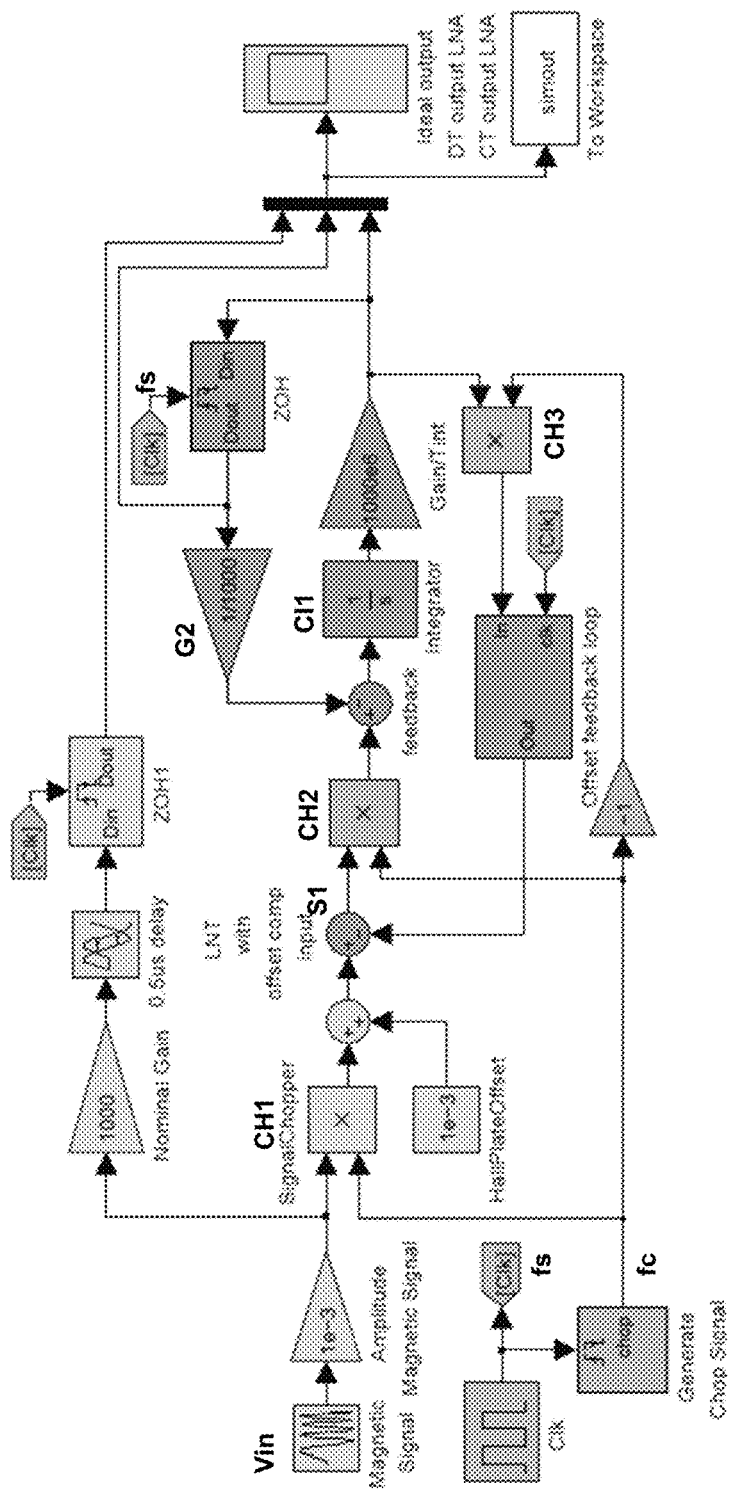

FIG. 16 shows a (system-level) simulation model (Simulink model) of the circuit of FIG. 14.

Figure 17:
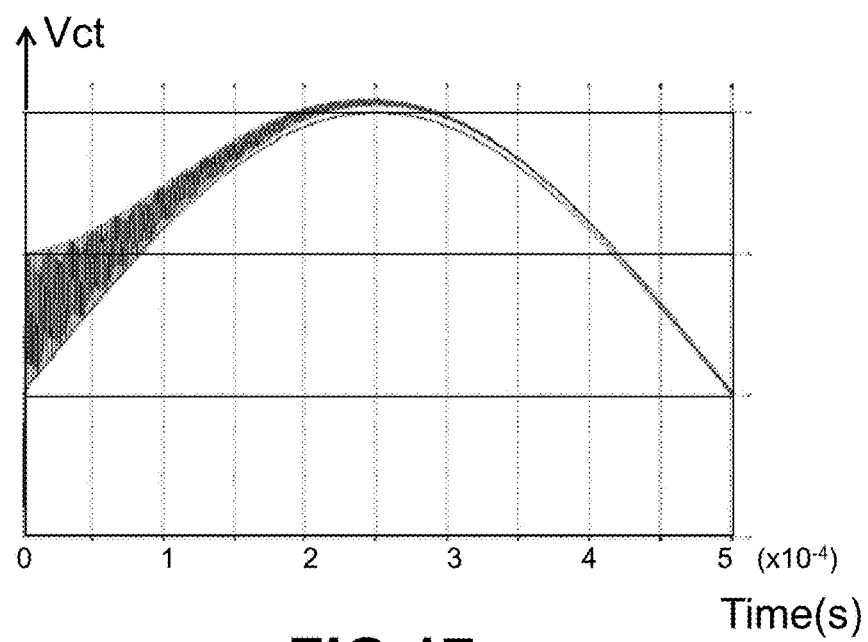

FIG. 17 shows an example of a continuous-time continuous-amplitude output signal obtainable by the circuit of FIG. 14 as simulated by the model of FIG. 16.

Figure 18:
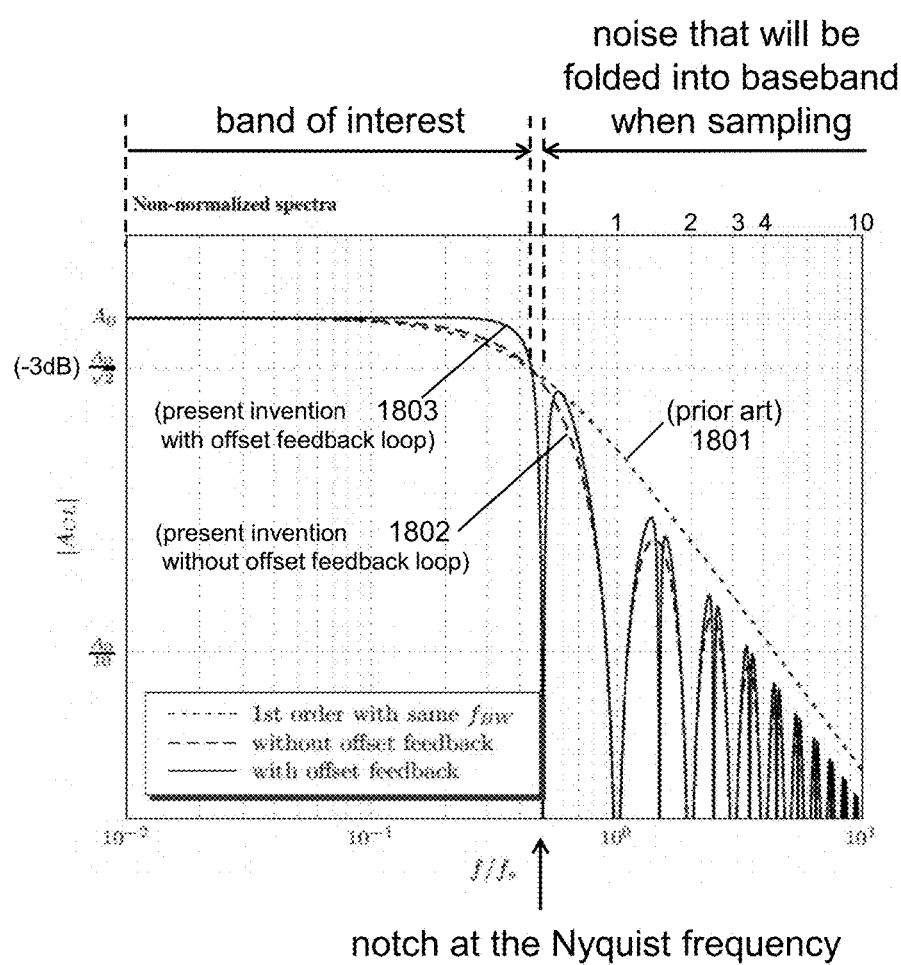

FIG. 18 shows a plot of the transfer function of the circuit shown in FIG. 14 (from the input to the sampled output Vdt) with and without the second feedback loop, on a logarithmic frequency scale and a logarithmic amplitude scale.

Figure 19:
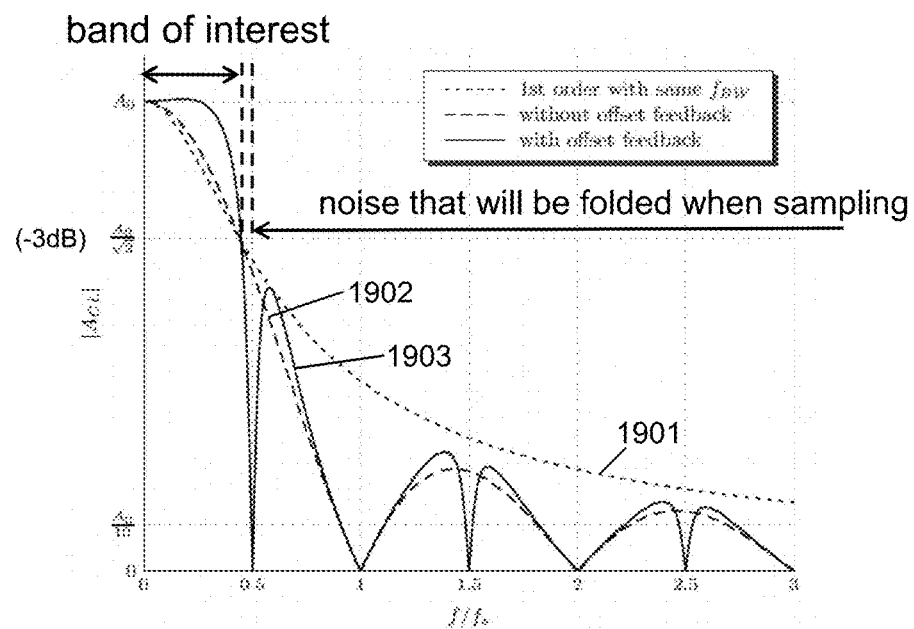

FIG. 19 shows the plots of FIG. 18 on a linear frequency scale (normalized to the sampling frequency) and a linear amplitude scale, to better appreciate the behavior in the pass-band.

Figure 20:
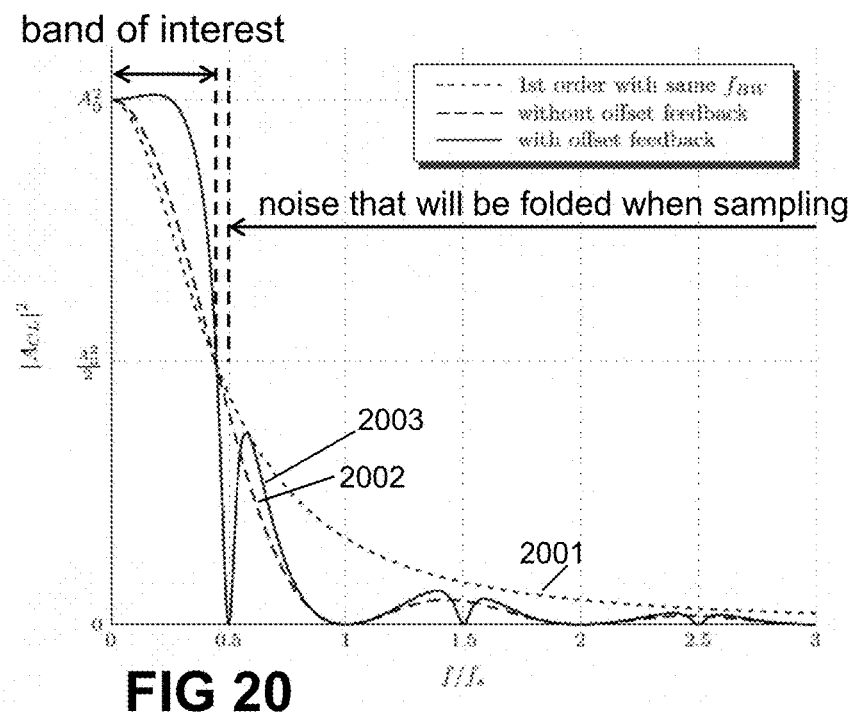

FIG. 20 shows the square of the amplitude of the transfer functions shown in FIG. 18 and FIG. 19 on a linear amplitude scale and a linear frequency scale. It allows to better appreciate the amount of white-band noise that will be added by the amplifier circuit to the band of interest as aliasing noise, when the amplified signal is digitized without an intermediate analog filter in front of the ADC (see FIG. 2 in the absence of the optional filter).

Figure 1:
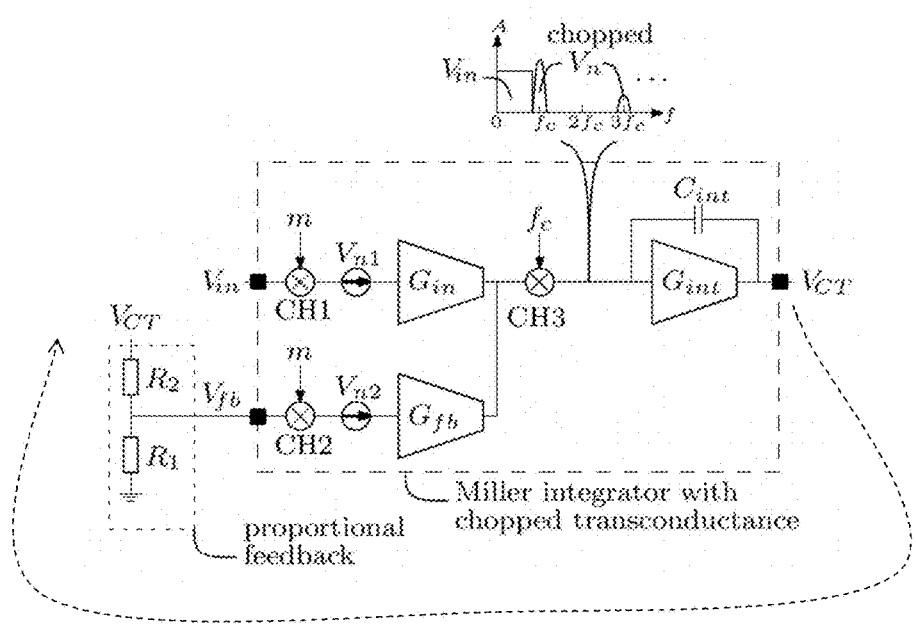
FIG. 1 shows an amplifier circuit known in the art.
Figure 21:
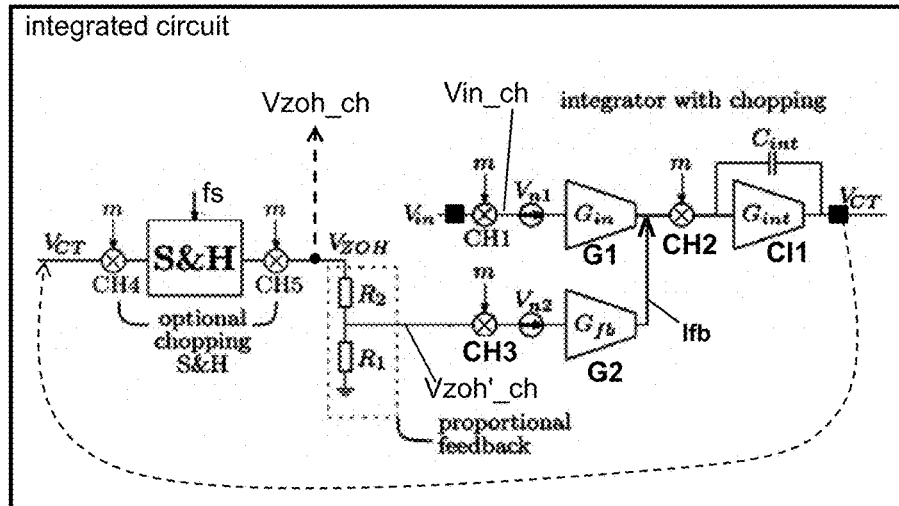

FIG. 21 shows another embodiment of the present invention, which can be seen as a modification of the prior-art circuit shown in FIG. 1, additionally having a sample-and-hold circuit in the first feedback path operated at sampling frequency fs=N·fc, N being an integer larger than zero, preferably N=1 or 2), and the components being sized such that the overall gain is at least a factor of 2.0, and such that the charge on the integrating capacitor is completely removed after a single sampling period Ts=1/fs assuming a zero input signal. The fourth and fifth chopper are optional.

Figure 22:
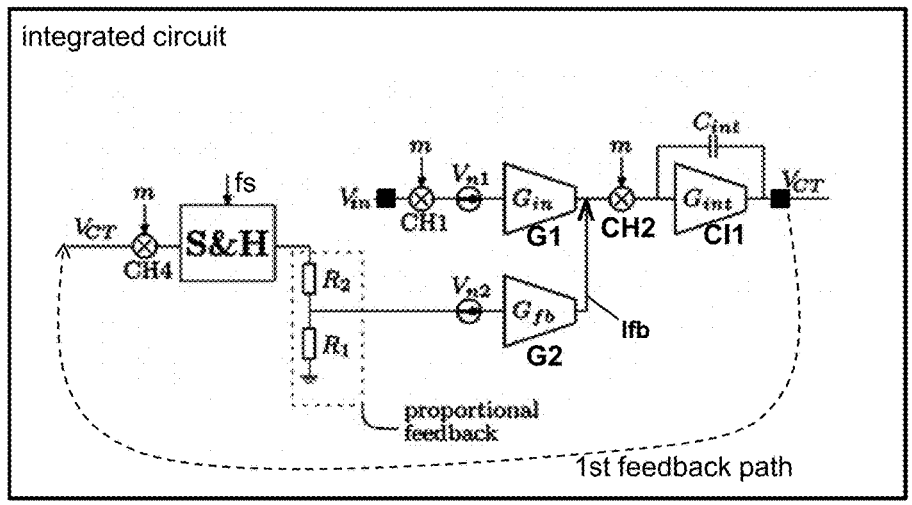

FIG. 22 shows a variant of the circuit of FIG. 21, as another embodiment of the present invention, functionally equivalent to the circuit of FIG. 21 including the fourth and fifth chopper.

Figure 23:
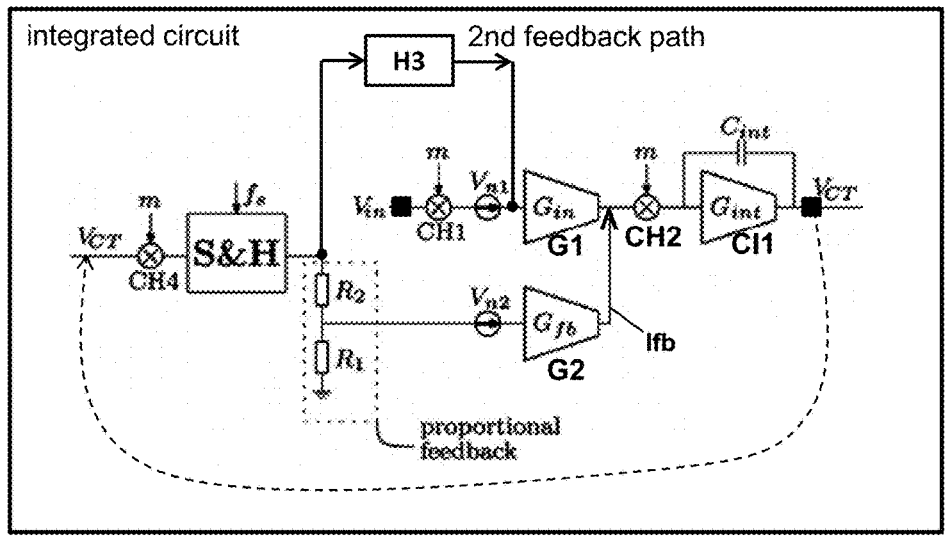
Figure 24:
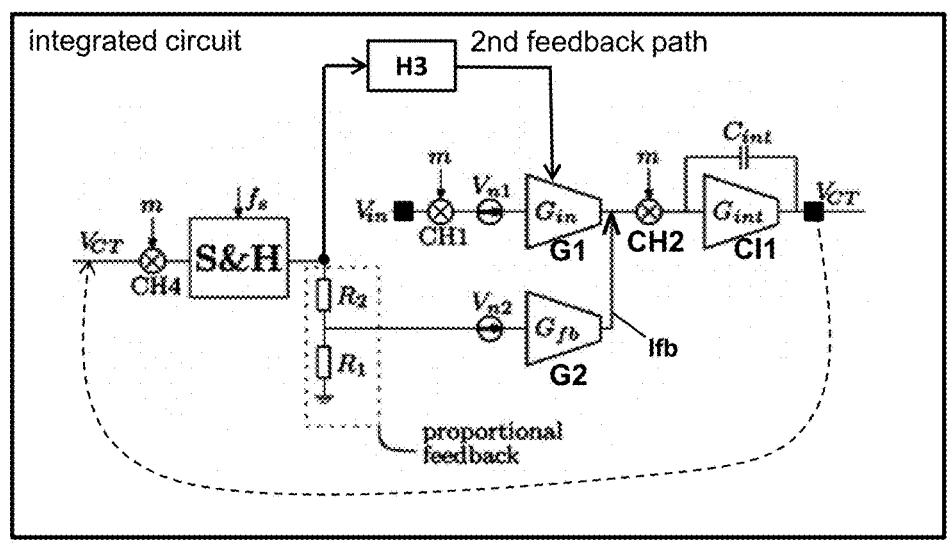
Figure 25:
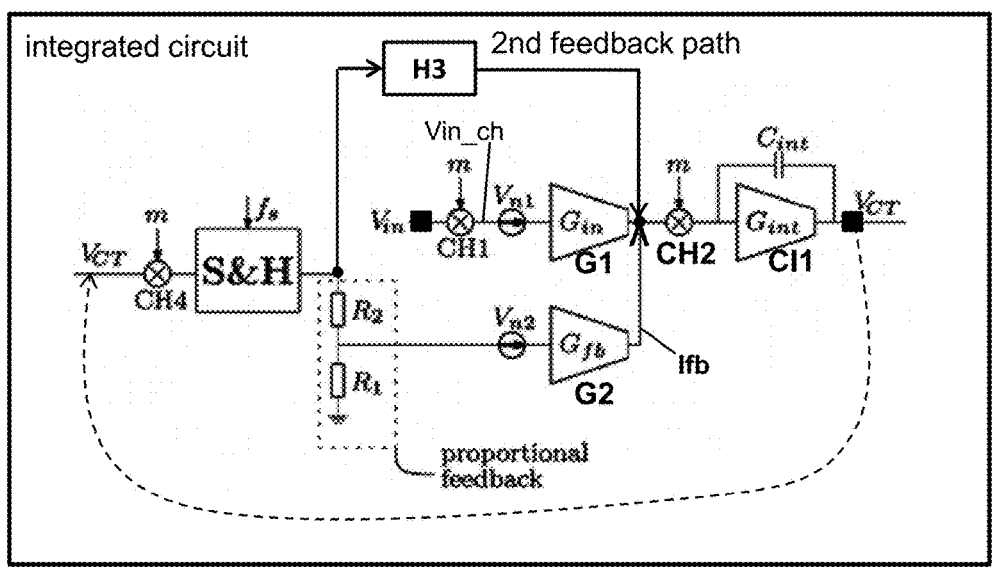

FIG. 23 to FIG. 25 show variants of the circuit of FIG. 22 having an additional second feedback loop for DC offset compensation. In FIG. 23 the second feedback signal is applied upstream of the first transconductance. In FIG. 24 the second feedback signal is applied to an internal node of the first transconductance. In FIG. 25 the second feedback signal is applied downstream of the first trans conductance.

Figure 26:
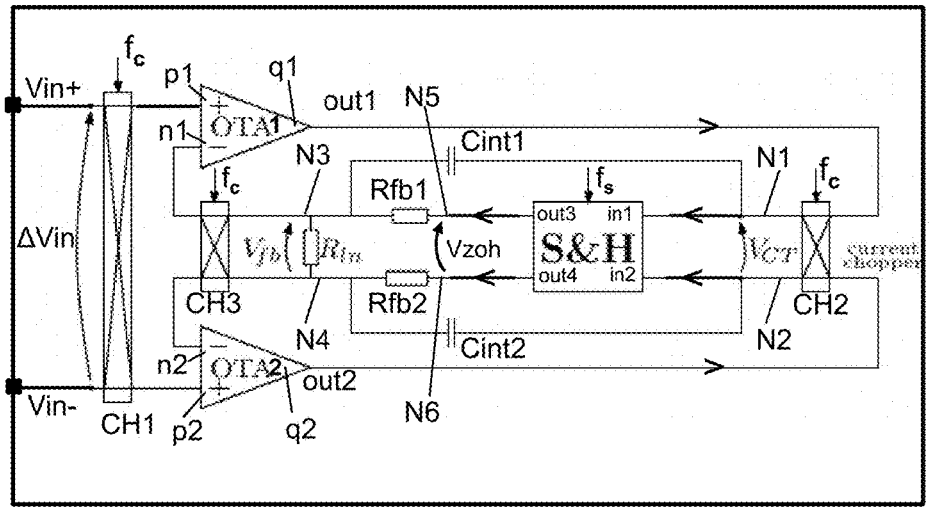

FIG. 26 shows another embodiment according to the present invention, comprising two OTA's, three choppers, and a sample-and-hold block arranged in a proportional feedback loop.

Figure 27:
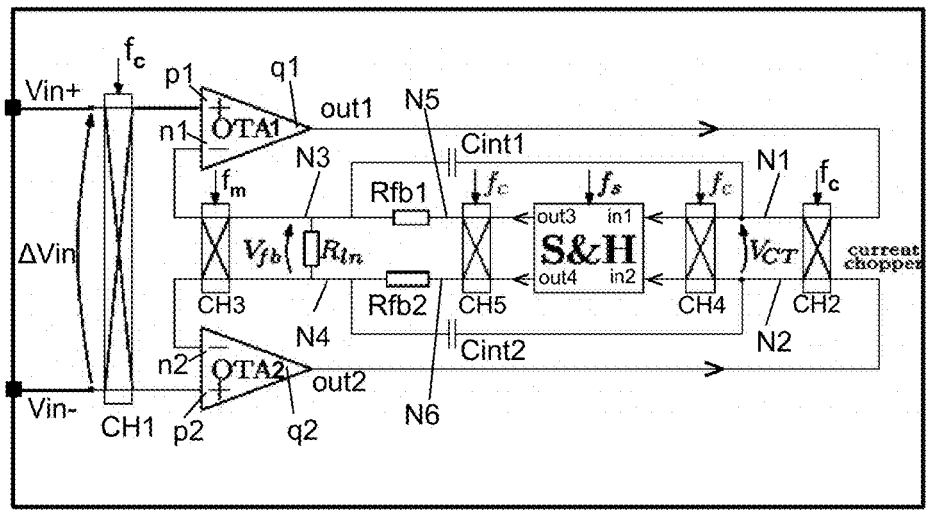

FIG. 27 is a variant of the embodiment of FIG. 26, further comprising a fourth and fifth chopper.

Figure 28:
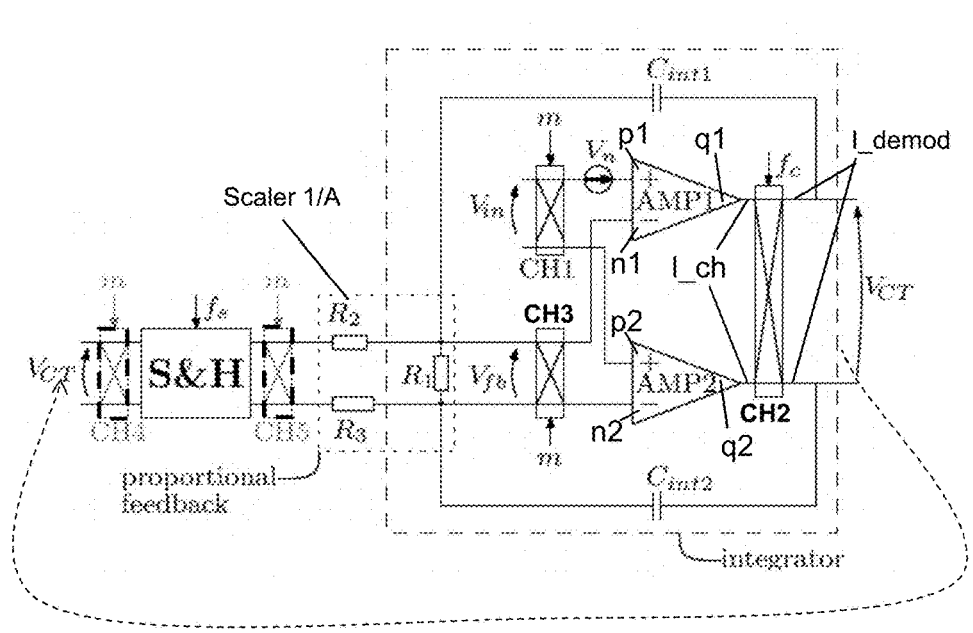

FIG. 28 shows a similar circuit as FIG. 26 and FIG. 27 (depending on the presence of the optional fourth and fifth chopper), but is slightly rearranged, to allow easier interpretation of how the circuit works.

Figure 29:
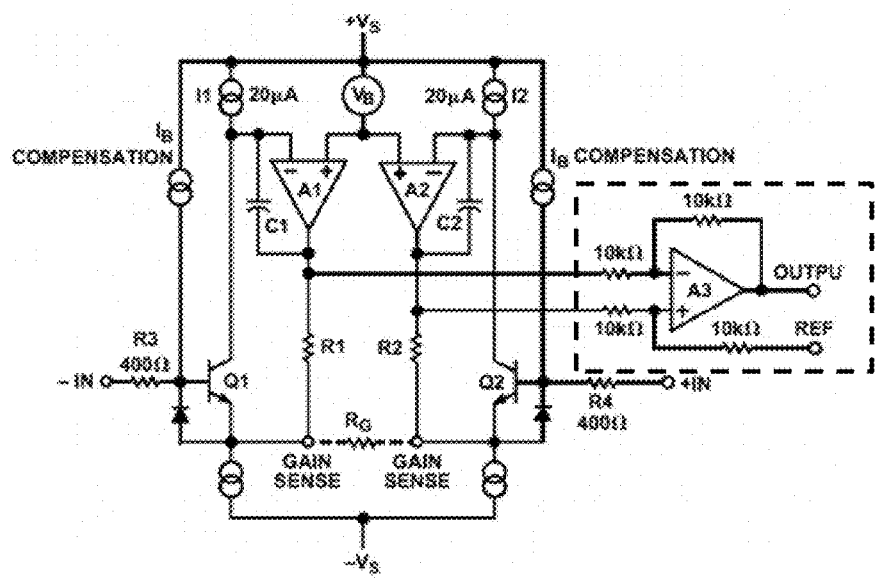

FIG. 29 shows another prior art amplifier circuit. This particular circuit is known already for at least two decades from Analog Devices.

Figure 30:
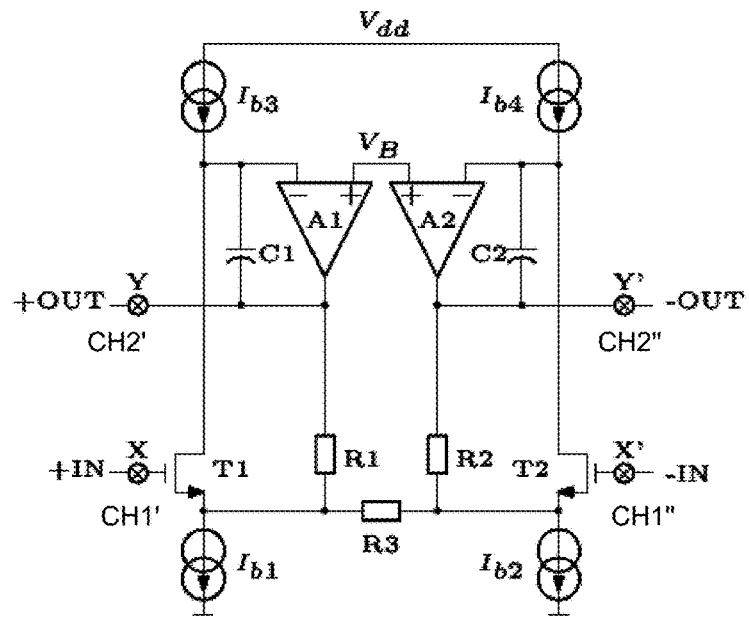

FIG. 30 shows the classical way of how the skilled person would add choppers to the amplifier circuit of FIG. 29 for reducing flicker noise.

Figure 31:
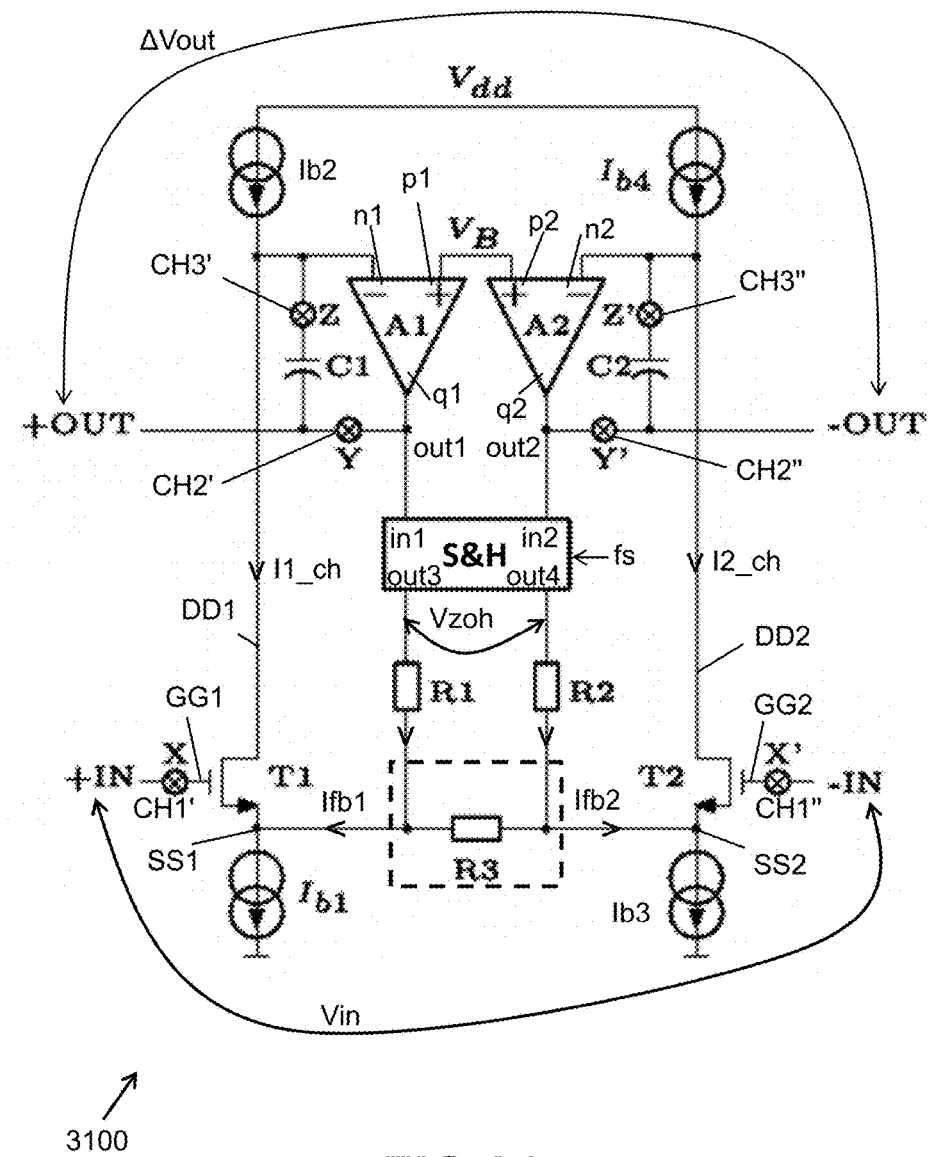

FIG. 31 shows an embodiment of the present invention, which can be seen as a modification of the prior-art circuit of FIG. 29, after adding choppers and a sample-and-hold circuit.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Definitions

Where in the present invention reference is made to a "chopper", what is meant is a block having an input port for receiving an input signal X(t), and a control port for receiving a control signal m(t), in particular a periodic blockwave having alternating values +1 and −1, and adapted for providing an output signal Y(t), which can be expressed in mathematical terms as the product: $Y(t)=m(t) X(t)$. The output signal is of the same nature as the input signal, e.g. both are voltages, or both are currents. The input and/or output signal may be a differential signal, in which case the actual signal is defined by the difference in voltage or current at two nodes of the port. The input and/or output signal may be a single-ended signal, in which case the actual signal is defined as the voltage or current at one node representative for the input port, relative to a constant reference voltage (e.g. ground) or reference current. It is known in the art that choppers can be implemented in most cases with not more than four switches. Examples are provided e.g. in [Enz96] FIG. 15 (single-ended input, differential output) and FIG. 54 (differential input and output). It is also known that the series connection of two such choppers having the same modulation signal m(t) provides a signal equal to the original signal which was applied to the first chopper. It is also known that the frequency spectrum of a chopped signal corresponds to convolution of the spectrum of the input signal with a series of delta functions with decreasing amplitude and located at 1×fc, 3×fc, 5×fc etc, (fc being the chopping frequency). The interested reader may refer for example to FIG. 9 of [Enz96], mentioned in the background section.

Where in the present invention reference is made to a "Zero-Order-Hold" circuit (abbreviated as ZOH), what is meant is a circuit having an impulse response function f(t) which is equal to 1.0 for a predefined time interval T, and is equal to 0 elsewhere, without amplitude quantization other than by physical quantities such as for example integer numbers of photons or electrons. Typically a sample-and-hold circuit or zero-order-hold circuit is periodically sampled at a frequency fs, in which case the predefined time-interval T may be equal to the sampling period Ts=1/fs, but that is not absolutely necessary, and T may also be chosen as another fraction of the sampling period Ts, preferably at least 50% of the sampling period, for example 50% or 75% thereof. This means that an Analog-to-Digital Converter (ADC), even a 10-bit ADC or a 12-bit ADC or a 16-bit ADC does not qualify as a "zero-order-hold circuit" as defined herein.

Figure 2:
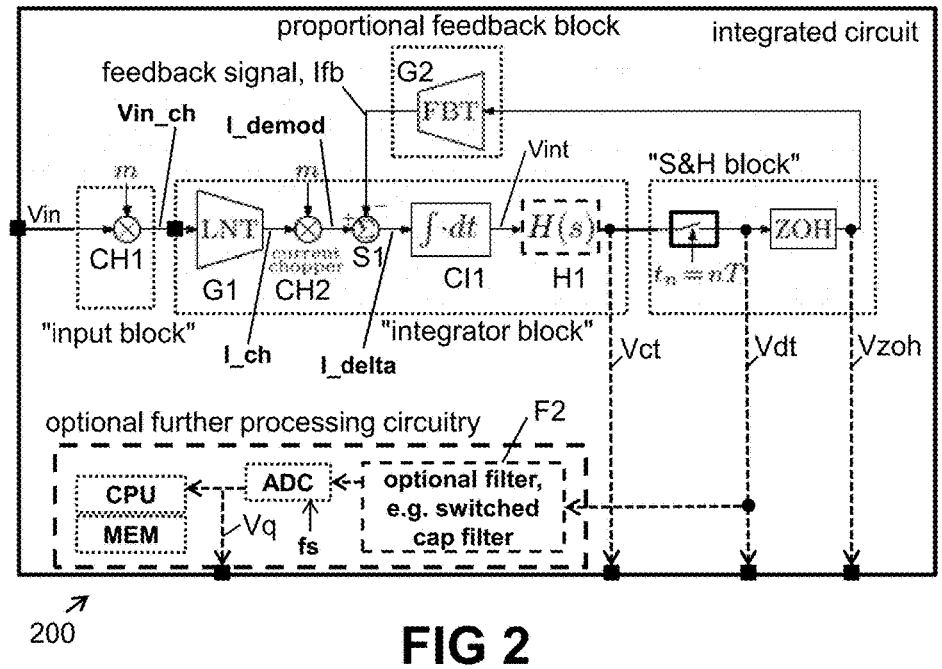
FIG. 2 shows an embodiment of an electronic circuit according to the present invention.

In this document, the terms "zero-order-hold circuit" and "sample-and-hold circuit" are used as synonyms.

Where in the present invention, it is stated that block B (or component B) is arranged "downstream" of block A (or component A), what is meant is that an (or the) output of block A is connected to an (or the) input of block B, either directly (i.e. without any intermediate blocks or components), or indirectly (i.e. with only a few, e.g. only one or only two components or blocks in between, such as e.g. one summing element, or two summing elements connected in series, or a resistor divider, etc.). Stated in other words, it thus means that block A and block B are connected in series, with optionally a few (e.g. only one or only two) other blocks or components in between. As an example, the first transconductance G1 of FIG. 2 is located "downstream" of the first chopper CH1 in such a way that the output of the first chopper CH1 is "directly connected" to the input of the first transconductance G1. As another example, the current integrator CI1 of FIG. 2 is located "downstream" of the second chopper CH2, but there is a summing element S1 in between, thus an input of the current integrator CI1 is connected albeit indirectly to the output of the second chopper CH2 with only one component S1 in between.

Where in the present invention, it is stated that block A is arranged "upstream" of block B, what is meant is that block B is arranged "downstream" of block A.

Unless explicitly mentioned otherwise, the term "feedback signal" (without prefix first or second) means "first feedback signal", and the term "feedback path" (without prefix first or second) means "first feedback path".

Unless explicitly mentioned otherwise, the term "sampling frequency" (without prefix first or second) means the sampling frequency fs applied to the sample-and-hold block of the first feedback path. In fact, the only embodiment shown wherein two different sampling frequencies are used is that of FIG. 15, where it is explicitly mentioned.

The terms "feedback path" and "feedback loop" are used as synonyms.

In this document, the expression "second feedback loop" and "offset feedback loop" are used as synonyms.

Where in the present invention reference is made to a "current source", what is meant is a component capable of providing a current to a node, substantially independent on the voltage of that node. Typically a current source has a very large output impedance, e.g. at least 1 K Ohm, or at least 10 K Ohm. (thus a supply voltage node VDD or a ground node GND does not qualify as a "current source" because these nodes typically have a very small output impedance).

The term "low noise" is used in its well-recognised meaning in the field of amplifier circuits, more specifically in the fields of amplifier circuits implemented in semiconductor devices, such as e.g. sensor products comprising a sensor element and an amplifier circuit.

Many different types of amplifier circuits are known in the art, and they are used for a large variety of different applications for amplifying a large variety of signals, and the requirements (e.g. in terms of bandwidth, gain, noise, input level/power, output level/power, power efficiency, group delay, etc.) of the amplifier circuits can vary largely for each application. For example, for high quality audio signals, the useful bandwidth of the signal is typically 20 Hz to 20 kHz, but the input and output levels (or power) vary considerably between an amplifier in an hearing aids, an amplifier for a home-cinema system, and an amplifier for loudspeakers at a rock concert. Wireless communication systems (e.g. radio, satellite) typically have to amplify very small signals at relatively high bandwidth, but it will be clear that the requirements for deep space communication are much more severe.

The present invention is related to the field of amplification of low-level signals such as can be obtained for example from sensors, such as for example a single-ended or differential voltage signal provided by a thermocouple or a thermopile (indicative of a temperature to be measured, which may in turn be indicative for an amount of IR radiation received), or a differential voltage obtained from a Hall sensor (e.g. indicative of a magnetic field to be measured), or a differential voltage provided by a Wheatstone bridge (e.g. indicative of an absolute pressure or a pressure difference to be measured), etc.

In many prior art applications, additional post-processing is done on the amplifier output signals. This may include filtering (e.g. for suppression of upconverted offset and flicker noise), additional amplification, analog-to-digital conversion, etc. Analog post-processing blocks can be operating in continuous-time or in discrete-time. However, circuits operating in discrete time are sampling-based, and hence noise folding may occur. Sampling also occurs in any types of analog-to-digital conversion. In general, modern electronic systems tend to digitize information as quickly as possible, migrating additional functionality and signal processing tasks as much as possible to the digital domain.

The present invention is primarily aimed at "low-noise" amplification. It is known in the art that the noise performance of an amplifier depends on the current that the amplifier is allowed to consume. Low-noise amplifiers are specifically designed such that for a given maximum supply current, the (input-referred) amplifier noise is reduced, e.g. minimized. When the amount of amplifier noise is fixed, e.g.

when this noise level is imposed by the application (e.g. depending on the environment conditions such as temperature), low-noise amplifier topologies reduce, e.g. minimize the needed supply current.

The inventors had the task of finding a circuit topology which can be largely, preferably completely integrated in a semiconductor device, and offers an improved noise performance, especially if no analog filter is used between an output of the amplifier and an input of an ADC following the amplifier circuit.

As a specific set of requirements, the amplifier circuit topology of the present invention should allow the circuit to be completely integrated, allow reading out a sensor element with a gain-factor of 1000, has a bandwidth (3 dB bandwidth) of at least 430 kHz, while adding only about 4 nV/√Hz of (input-referred) noise, and has an output which can be directly digitized (without requiring additional analog low-pass filter), but of course the present invention is not limited to circuits that satisfy this specific set of requirements.

First Embodiment

FIG. 2 shows a high-level block-diagram of a first embodiment of the present invention. FIG. 2 shows a semiconductor circuit comprising an amplifier circuit. The circuit comprises the following blocks:
an input block comprising a first chopper CH1 for providing a chopped input voltage signal Vin_ch indicative of a voltage signal to be amplified;
a first transconductance G1 arranged downstream of the first chopper CH1 and adapted for receiving a chopped voltage signal Vin_ch and adapted for converting said chopped voltage signal into a chopped current signal I_ch;
a second chopper CH2 arranged downstream of the first transconductance G1 adapted for providing a demodulated current signal I_demod;
a current integrator CI1 arranged downstream of the second chopper CH2, the current integrator CI1 comprising an integrating capacitor Cint for storing an integrated signal Vint and being adapted for providing a continuous-time signal Vct;
a first feedback path comprising:
a sample-and-hold block S&H arranged downstream of the current integrator CI1 and adapted for receiving the continuous-time signal Vct and for sampling said signal using a sampling signal having a sampling frequency fs, thereby providing a sampled signal Vdt, and for providing a zero-order-hold voltage signal Vzoh proportional to said sampled signal Vdt;
a first feedback block G2 arranged downstream of the sample-and-hold block S&H, the first feedback path being adapted for providing a first feedback signal Ifb proportional to the zero-order-hold signal Vzoh according to a predefined proportionality factor, the first feedback signal Ifb being provided to the current integrator CI1 or to a component or to a node upstream of the current integrator CI1.

The circuit is sized, i.e. the values of the components are chosen such that the amplitude ratio Vct/Vin of the continuous-time signal Vct output of the block H1 and the voltage signal to be amplified Vin is at least 2.0.

The first feedback block G2 is adapted for providing a feedback signal Ifb such that, for an input signal Vin equal to zero, and thus also the chopped input signal Vin_ch equal to zero, a charge stored on the integrating capacitor Cint at the beginning of a sample period is linearly removed during one single sampling period Ts of the sampling signal, in such a way that the charge is completely removed at the end of the single sampling period Ts.

Each chopper is adapted to be operated at a chopping frequency fc. Although not explicitly shown in the drawings, the signal m(t) stands for "modulation signal" and it has a frequency fc referred to as the "chopping frequency fc".

The sample-and-hold-block S&H is adapted to be operated at a "sampling frequency fs". The sampling frequency fs is equal to the chopping frequency fc, or is an integer multiple thereof, the integer being larger than zero. This can be written in mathematical terms as: fs=N·fc, where N can be chosen as 1, 2, 3, etc. In the drawings the sampling signal is sometimes denoted by "$t_n$=n·T" (see e.g. FIG. 2 to FIG. 7 and FIG. 10 to FIG. 13), where T is the sampling period T=1/fs, or sometimes by "fs" (see e.g. in FIG. 14 to FIG. 28 and FIG. 31), but the meaning is the same.

One or more of the signals Vct, Vdt and Vzoh may be provided as output signal, but that is not absolutely required. The signal Vct is a continuous-time signal, hence can be used when the amplifier needs to interface to continuous-time post-processing. The signal Vdt and Vzoh are time-discrete signals, hence can be used when the amplifier needs to interface to sampling-based post-processing. Since an important advantage of present invention over prior art relates to a lower level of noise-folding upon sampling the amplifier output, the noise characteristics of the time-discrete signals will be described further.

The mandatory components of the amplifier circuit, i.e. the first chopper CH1, the first transconductance G1, the second chopper CH2, the integrator CI1, the sample-and-hold block S&H and the second feedback block G2 may be completely integrated in a semiconductor device. Preferably these components are located on a single die.

It is pointed out that this high-level block-diagram can be implemented for amplifying a single-ended signal, or can be implemented for amplifying a differential signal. The step of converting the high-level schematic to a practical chip-implementation (at component or register-level) falls outside the scope of this document.

All choppers CH1, CH2 of the circuit are adapted to operate with a chopping signal m(t) having a chopping frequency "fc", and the sample-and-hold block S&H is adapted to operate with the sampling signal s(t) having a sampling frequency fs. An example of a sampling signal s(t) and a chopping signal m(t) are shown in FIG. 8, but other waveforms may also be used. The sampling signal and the chopping signal may be applied from outside the integrated circuit, or preferably they are at least partly generated in the same integrated circuit. For example, the integrated circuit may comprise a clock circuit, possibly connectable to an external crystal or an external timing signal, and may contain a clock divider circuit. Such circuits are known in the art, and hence need not be further described here.

The parts shown in dotted line (in particular filter H1, filter F2, ADC, CPU, MEM) are optional.

The block H1 is optional. If present, the block H1 may comprise additional filtering, e.g. a passive first order filter. But this block may also comprise an integrator or even an amplifier.

In order not to obscure the description, unless explicitly mentioned otherwise, the invention will be described as if block H1 is not present, in which case the output of the integrator CI1 is assumed to be connected to an input of the sample-and-hold block.

The embodiment of FIG. 2 may optionally further comprise an analog to digital convertor ADC. It is pointed out that the ADC (if present) is arranged outside of the feedback loop. This offers the advantage that the feedback loop does not suffer from increased noise due to amplitude quantization, and that speed of the amplifier circuit is not limited by the speed of the ADC, and that the ADC can be implemented in any known manner, e.g. in a pipelined manner. The ADC (if present) may be connected downstream of the integrator CI1, without an intermediate analog filter. Alternatively, an RC filter, e.g. a first order RC filter may be provided in the block H1 between the integrator CI1 and the ADC. The digitized output Vq may be used internally (e.g. by a microprocessor CPU) and/or may be provided as a digital output signal, depending on the application.

The integrated circuit may further comprise a digital controller or digital processor, e.g. a programmable microcontroller, or a hardcoded state-machine, connected to one or more memories, (e.g. RAM, ROM, FLASH, NVRAM, etc.) in a manner known in the art. The digital processor may be adapted for receiving the values Vq digitized by the ADC described above, and for performing calculations in the digital domain, such as for example for calculating an angular position based on the values obtained from a plurality of Hall sensors, which may be read-out by means of one or more amplifier circuits described above (see also FIG. 7), but the invention is not limited to angular position sensors.

As already discussed above, the circuit of FIG. 2 may further comprise a switched-capacitor circuit, e.g. a switched-capacitor filter F2. Switched-capacitor circuits typically have more robust characteristics compared to their continuous-time counterparts, which typically suffer from substantial process variations and drift with temperature. The design of switched cap filters is a very mature field.

How the Circuit of FIG. 2 Works:

Although the behaviour of each individual component of the circuit of FIG. 2 is known, the behaviour of the circuit of FIG. 2 as a whole cannot readily be contemplated, especially in terms of its noise behaviour, partly because the circuit has a feedback loop, but especially because the circuit is partly operating in continuous-time and partly in discrete-time, moreover based on two frequencies fs, fc which may be the same (e.g. fs=fc), or may be different (e.g. fs=2·fc).

Indeed, the forward path (from the voltage input node up to and including the current integrator CI1) operates in continuous-time, while the behaviour of the feedback path (comprising the second transconductance G2) is based on a value Vdt sampled in discrete-time. Whereas the behaviour (stability, amplification, etc.) of a continuous-time system with a continuous-time feedback loop is well understood in the prior art, the behavior of mixed-time circuits is not so well understood.

It is noted that the sample-and-hold block is considered as part of the "feedback path", and not of the "forward path", but the exact border between "forward path" and "feedback path" of a circuit containing a feedback loop is somewhat arbitrary, and is not relevant for the invention. To avoid confusion, the terms "downstream" and "upstream" are used to describe the relative position of components in the circuit.

In order to get a better feeling of what happens in the time-domain, different parts of the circuit will first be described separately. The behaviour of the circuit as a whole, will be described later (in relation to FIG. 14 to FIG. 20).

Behaviour of the Sub-Circuit Containing CH1+G1+CH2:

The behaviour of the partial circuit from the first chopper CH1, the first transconductance G1, and the second chopper CH2 is presumed to be well understood. In short, the first chopper CH1 modulates the input voltage signal Vin to move the baseband signal (i.e. DC and low frequencies) to higher frequencies (around the chopping frequency fc and odd multiples of fc) where there is no significant flicker noise. The transconductance G1 converts the voltage signal into a current signal, and inevitably adds an amount of noise. The second chopper CH2 modulates the noise added by the first transconductance G1 to higher frequencies (around fc) while demodulating the current signal (around fc) back to baseband. As a result, the noise introduced by the tranconductance G1 is upconverted to higher frequency bands, away from the baseband. This behaviour is known in the art.

Behaviour of CI1:

Assuming first that the first feedback signal Ifb is zero, and that the initial state of the integrating capacitor (part of the current integrator CI1, but not explicitly shown) is zero, the behaviour of the current integrator CI1 is, as the name suggests, to integrate the demodulated current I_demod, thereby converting the current I_demod into a voltage Vint. For example, a constant current I_demod would result in a linear increase with time of the charge stored on the integrating capacitor, and thus in a linear increase with time of the output voltage of the current integrator CI1, as illustrated by curve 93 and 94 in FIG. 9. At the same time, this integration has an inherent filtering characteristic, because integration averages out high-frequency signals. This inherent filtering characteristic suppresses high-frequency noise components, thus providing a first contribution to the low noise properties of the amplifier. In practice the input signal Vin may not be constant, but may vary during the time interval Ts, in which case the signals 93, 94 will deviate from a linear curve.

Behaviour of Sample & Hold Block:

The behaviour of a sample-and-hold block is well known in the art, and can for example be implemented by a switch (operated at the sampling frequency) and a capacitor for storing charge, possibly followed by a buffer for allowing readout of the capacitor voltage without removing charge from the capacitor. It is pointed out that, in embodiments of the present invention, the sample-and-hold circuit stores continuous-amplitude signals, (also known as "analog signals"), not discrete-amplitude signals (also known as "quantized signals"). Thus an ADC and a DAC connected in series do not qualify as a S&H block of the present invention. The output signal of the sample-and-hold block is referred to herein as "zero-order-hold voltage" Vzoh. The input voltage of the Sample & Hold block may be the integrator voltage Vint, the signal Vct related to Vint through an optional filter block H1, or any of these signals scaled down (e.g. by means of a voltage divider). Indeed, if the gain of the circuit is for example 1000, the integrated signal needs to be attenuated by a factor 1000 in the feedback path. This attenuation may be implemented completely in the second transconductance G2, downstream of the sample-and-hold block, or may be partly attenuated upstream of the sample-and-hold block.

Behaviour of the First Feedback Path:

The inventors came to the idea of providing a first feedback signal (directly or indirectly) upstream of the current integrator CI1, and to size the feedback path in such a way that a charge present on the integrating capacitor Cint at time t1=n·Ts will be completely removed at time t2=(n+1)·Ts, i.e. after exactly one period Ts=1/fs (assuming that the input signal Vin is zero). According to embodiments of the present invention, this functionality can be realised by providing a (first) feedback signal Ifb that is proportional to the zero-order-hold signal Vzoh. While the proportional feedback path may have one or more sign reversals at various places, the net effect is to provide negative feedback (schematically indicated by the minus-sign of the summing element S1 in FIG. 2). If the input signal Vin (or Vin_ch) is zero, the proportional feedback signal will linearly remove the charge on the integration capacitor of CI1, as illustrated in FIG. 9 by straight line 91 and straight line 92.

During normal operation of the circuit, when the input signal Vin and thus also I_demod is not zero, the feedback signal Ifb is subtracted from the demodulated signal I_demod in the summing element S1, and the combined current I_delta will be applied to the input of the current integrator CI1. The result being that the voltage over the integrating capacitor varies as the sum of signal 91 and signal 93 from time $t=(n-1)\cdot Ts$ to $t=n\cdot Ts$, and hence gradually varies from the value $V_{n-1}$ to $V_n$. Then a new sample of Vzoh is taken, and the integrating capacitor is discharged (e.g. linearly discharged if H1 is absent) according to signal 92, while being charged according to signal 94 (not necessarily linearly), together moving the voltage corresponding to the charge on the capacitor from $V_n$ to $v_{n+1}$, etc. It is noted that due to the particular discrete feedback being applied, an arbitrary state of the integrator at time $n\cdot Ts$ is completely erased after one period Ts, and the new state of the integrator at time $(n+1)\cdot Ts$ is solely determined by integration of the input signal over the sampling period Ts. It is also noted that a sudden change in the input leads to an immediate change in the current I_demod, which directly changes the direction in which the integration output signal Vint evolves. The integrator output therefore has a low latency (delay), substantially less than an integration interval Ts. For some applications, such a low-latency response is advantageous.

Behaviour of the Entire Circuit:

The attentive reader will probably have recognized that signals $V_{n-1}$, $V_n$, $V_{n+1}$ do not change sign each period, because the first chopper CH1 is modulating and the second chopper CH2 is demodulating with the same chopper signal m(t), and thus cancel each other. Hence, there is no net translation in frequency from the amplifier input voltage Vin to the integrator output voltage Vint. In contrast, the offset and flicker noise of the first transconductance G1 has been upconverted to the chopping frequency fc, and is filtered out to some extend by the integration of CI1. It takes additional effort to recognize that the integrator output Vint is an amplified version of the input signal Vin, especially because the transfer from input to output is not time-invariant (i.e. an arbitrary shift in time of the input signal Vin may lead to an output signal which is not just the same output signal shifted over the same time). In spite of this, the system behaves as an amplifier with a low-frequency gain $A_0$, which can be expressed by the mathematical formula:

$$A_0 = (Ts \cdot G_1)/Cint \quad [1]$$

where Ts=1/fs is the sampling period at which the sample-and-hold block is operated, G1 is the transconductance of the first transconductance, and Cint is the capacity of the integrating capacitor.

The most surprising effect comes from an analysis of the circuit behaviour in terms of noise. In general, sampling in the time-domain leads to increased noise due to folding of noise components beyond the Nyquist frequency into the base band. However, contrary to what is expected, the sampling-based feedback path leads to an amplifier with less noise folding as compared to an amplifier with continuous-time proportional feedback, as will be demonstrated further by means of simulations and calculations. This circuit (if properly sized) thus may offer significant improvements in terms of noise reduction, which, as far as is known to the inventors, are unprecedented in the prior art (assuming the same current consumption).

Possible Method of Sizing the Components:

Although the behaviour of some blocks of the circuit of FIG. 2 is fixed (e.g. the choppers CH1, CH2, the sample-and-hold block S&H, the summator S1), there is still design freedom in the implementation of these blocks in a particular technology, and in the implementation and sizing of some blocks such as e.g. the transconductance G1, the current integrator CI1 (in particular the integrating capacitor Cint thereof), the transconductance G2, as well as the sampling frequency fs and the chopping frequency fc.

The considerations for deciding the chopping frequency are very similar to what is the case for prior art circuits. For a given input signal, the chopping frequency fc needs to be at least larger than the bandwidth $f_{BW}$ of the input signal, that is the ratio $fc/f_{BW}$ needs to be larger than one. In the prior art, when technically possible, a large $fc/f_{BW}$ ratio (e.g. a factor 10 or more) is often preferred, because this helps in the suppression of upconverted offset and flicker noise. However, there are often practical upper limits to the chopping frequency, for example:

to keep residual offset due charge injection of the chopper switches sufficiently low (increases with chopper frequency fc), or to have sufficient settling in view of parasitic RC effects (e.g. when chopping a sensor). For clarifying the rest of the sizing, the chopping frequency can be considered as given.

In preferred embodiments of the present invention, the sampling frequency fs is chosen equal to $N \cdot fc$, where N is an integer value larger than zero, for example N=1 or N=2. The components of the blocks (G1, CI1, G2) can then be designed for example so as to obtain a predefined gain factor $A_0$ larger than 2.0, for example 1000, and such that the charge on the capacitor is removed after one sample period Ts=1/fs (assuming the input signal is zero). The latter "state-erasing" condition can be expressed in mathematical form as:

$$Ts \cdot G_2/Cint = 1 \quad [2]$$

where Ts=1/fs is the sampling period, G2 is the transconductance of the feedback block, and Cint is the capacity of the integrating capacitor. This condition may be used to deduce the size of the integration capacitor as:

$$Cint = Ts \cdot G_2 \quad [3]$$

Combining formula [1] and [2], allows the gain to be written as the ratio of the first and second transconductance, namely:

$$A_0 = G_1/G_2 \quad [4]$$

where G1 is the first transconductance, and G2 is the second transconductance.

The attentive reader will realize that there are three variables: G1, G2 and Cint but at this point there are only two requirements, as expressed by formula [3] and formula [4]. The remaining requirement comes from the targeted noise-performance of the amplifier, which is dominated by the input transconductance G1. The skilled person can choose an appropriate G1 depending on the envisioned noise behavior. When G1 is chosen too small, the (input-refered) white noise of the amplifier circuit may not be sufficiently low. When G1 is chosen too large, the circuit consumes more current than needed.

Variants of the Circuit of FIG. 2:

Before describing the noise behaviour of the circuit, a number of variants of the circuit shown in FIG. 2 will be described. In particular,

- different input blocks that provide a chopped voltage signal can be used, as will be illustrated in FIG. 3 to FIG. 7, and
- different first feedback paths can be used, as will be illustrated in FIG. 10 to FIG. 13, and
- optionally a second feedback path can be added, as will be illustrated in FIG. 14 and FIG. 15.

Different Input Blocks:

In the embodiment of FIG. 2, the voltage signal to be amplified comes from a node, e.g. from a node on the same die, or from a pad of a semiconductor substrate, or from a pin of a packaged semiconductor device.

Figure 3:
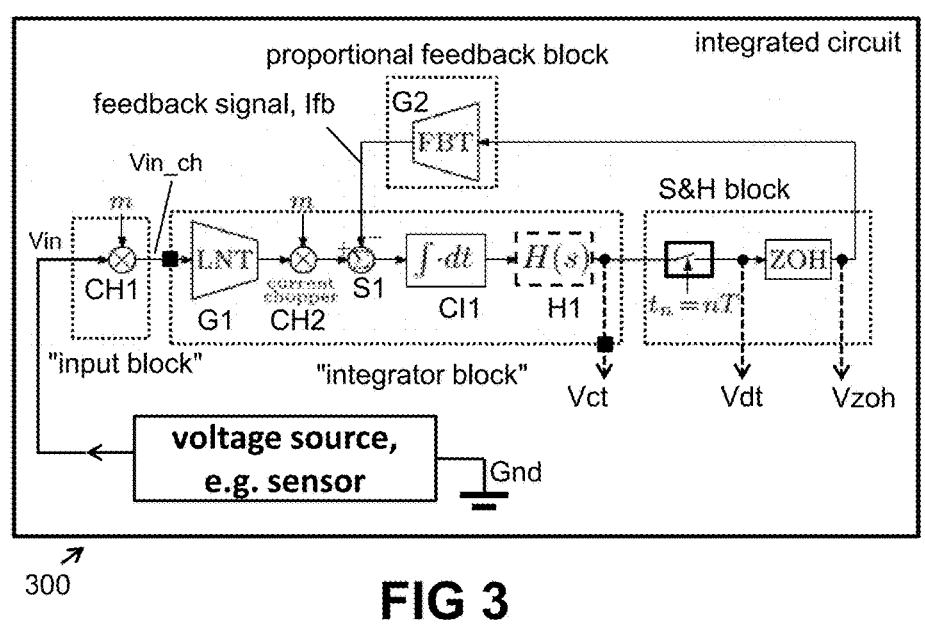
FIG. 3 to FIG. 7 show a first set of variants of FIG. 2, as embodiments of the present invention, illustrating several ways of where the voltage signal to be amplified can come from. This additional circuitry may for example be located on the same die as the amplifier circuit, or may for example be located on a second die included in a single package.

In FIG. 3 the voltage to be amplified Vin comes from an internal voltage source, e.g. from an embedded sensor, such as for example a thermocouple or thermopile. This voltage may be a single-ended voltage or a differential voltage signal.

Figure 4:
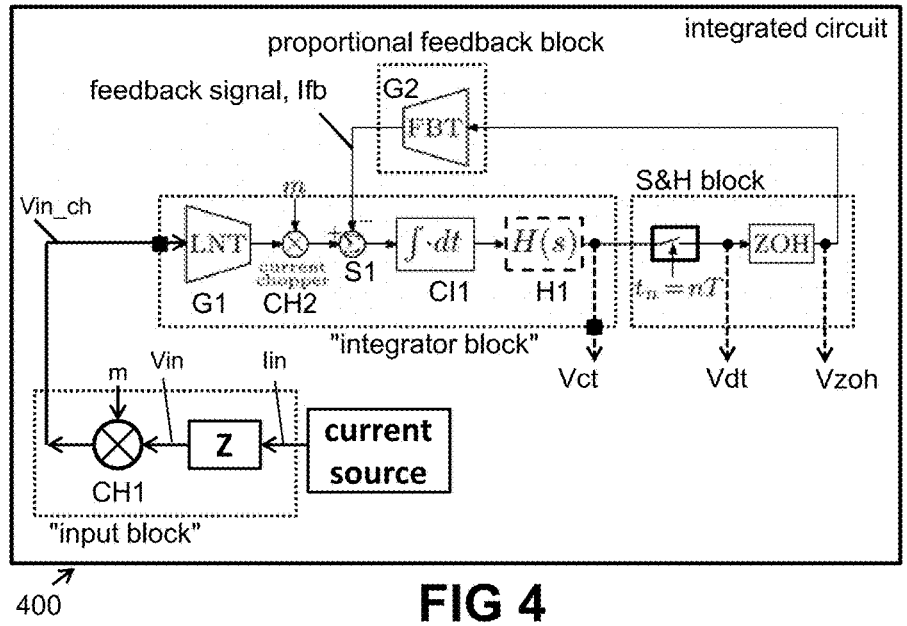

In FIG. 4, the voltage to be amplified is generated by an internal current source connected to an internal impedance (e.g. a resistance) or transimpedance Z (e.g. a Wheatstone bridge), for example connected in series with the current source. All components shown in FIG. 4 may be located on a single die.

In a variant (not shown) of the circuit of FIG. 4, the voltage to be amplified is generated by an internal voltage source connected to an internal impedance or transimpedance Z.

In a variant (not shown) of the circuit of FIG. 4, the current or voltage used for excitation of the impedance or transimpedance Z comes from a node, e.g. from a pad or from a pin, while the impedance or transimpedance Z is part of the integrated circuit. For example, the excitation source may be located outside of the integrated circuit, on a second die connected to the first die (e.g. via bonding wires or in any other way), but encapsulated in the same chip-package.

In yet another variant (not shown) of FIG. 4, both the current source and the impedance or transimpedance Z, or in general an excitation source and an impedance or transimpedance, may be located on a second die connected to a first die, the first die comprising at least the first transconductance G1, the second chopper CH2, the current integrator CI1, the sample-and-hold block C&H, and the second transconductance G2.

In yet another variant (not shown) of FIG. 4, the biasing source or excitation source, e.g. current source or voltage source is part of the first die, and the impedance or transimpedance is part of a second die.

Figure 5:
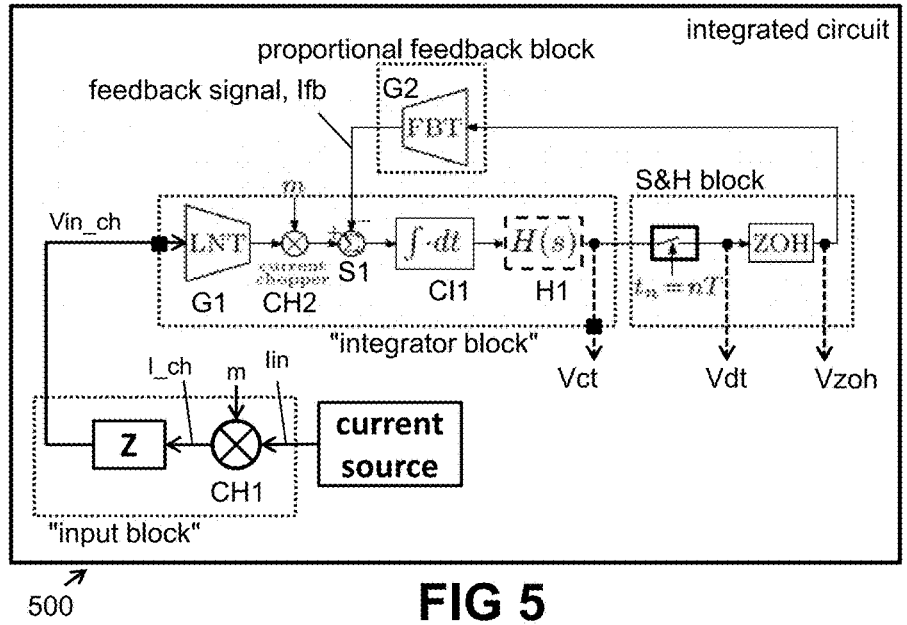

FIG. 5 shows a variant of FIG. 4, wherein the first chopper CH1 is located downstream of the impedance or transimpedance Z. The "voltage signal to be amplified" is the voltage that would be generated if the first chopper CH1 received a non-alternating signal m(t)=+1. All components shown in FIG. 5 may be located on a single die.

In a variant of the circuit of FIG. 5 (not shown), an internal voltage source is used for excitation instead of the internal current source shown in FIG. 5.

In a variant of the circuit of FIG. 5 (not shown), the biasing or excitation current or voltage comes from a node, e.g. from a pad or from a pin, while the impedance or transimpedance Z is part of the first die where also G1, CH2, CI1, S&H and G2 are located. In yet another variant, both the excitation current source and the impedance or transimpedance Z are located on a second die, different from the first die.

Figure 6:
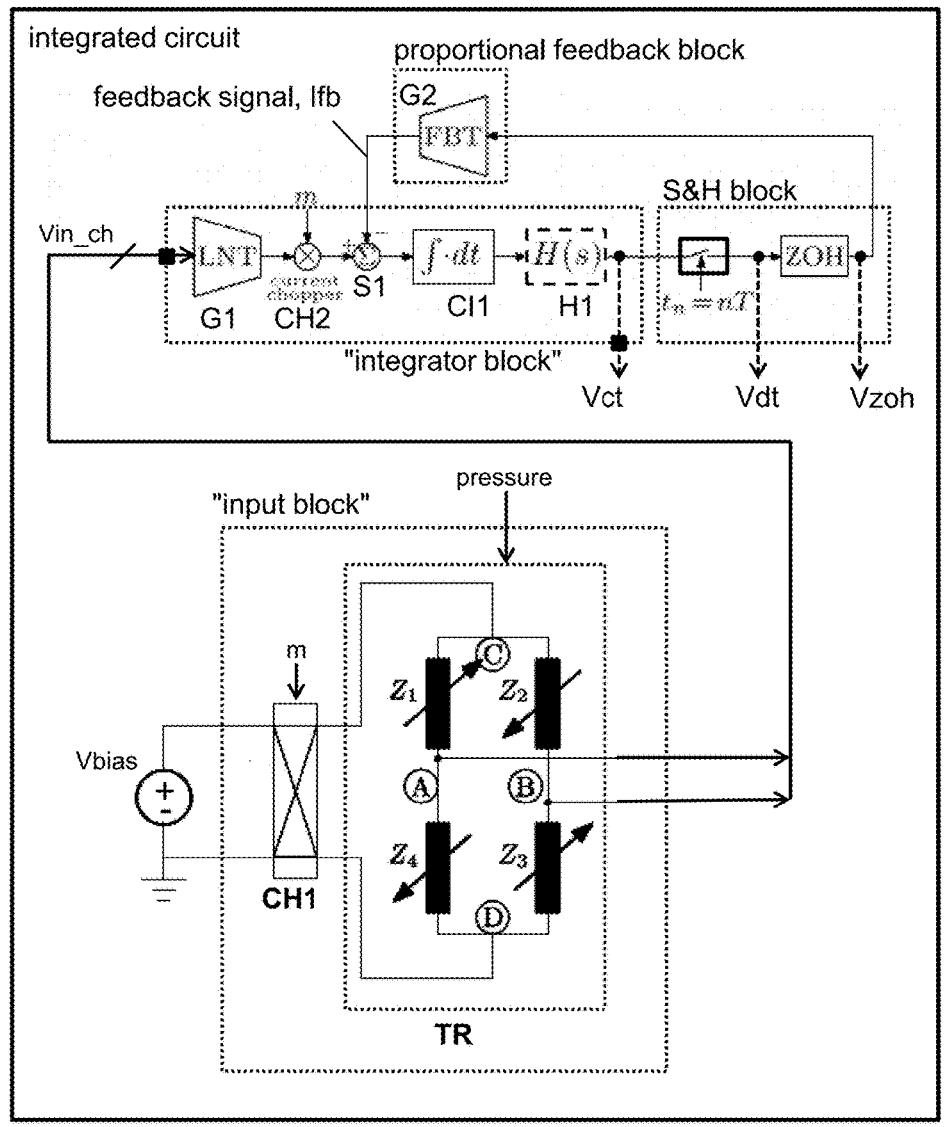

In FIG. 6, the input block contains a biasing source (here: a biasing voltage Vbias) and a transducer TR (here: a Wheatstone bridge having four piezo-resistive elements arranged on a membrane, the membrane being deformable by a pressure to be measured). Similar to FIG. 5, the first chopper CH1 is located upstream of the transducer TR, so that the biasing source Vbias is chopped. The "voltage signal to be amplified" can be seen as the voltage signal that would be generated if the first chopper CH1 would receive a non-alternating signal m(t)=+1.

Figure 7:
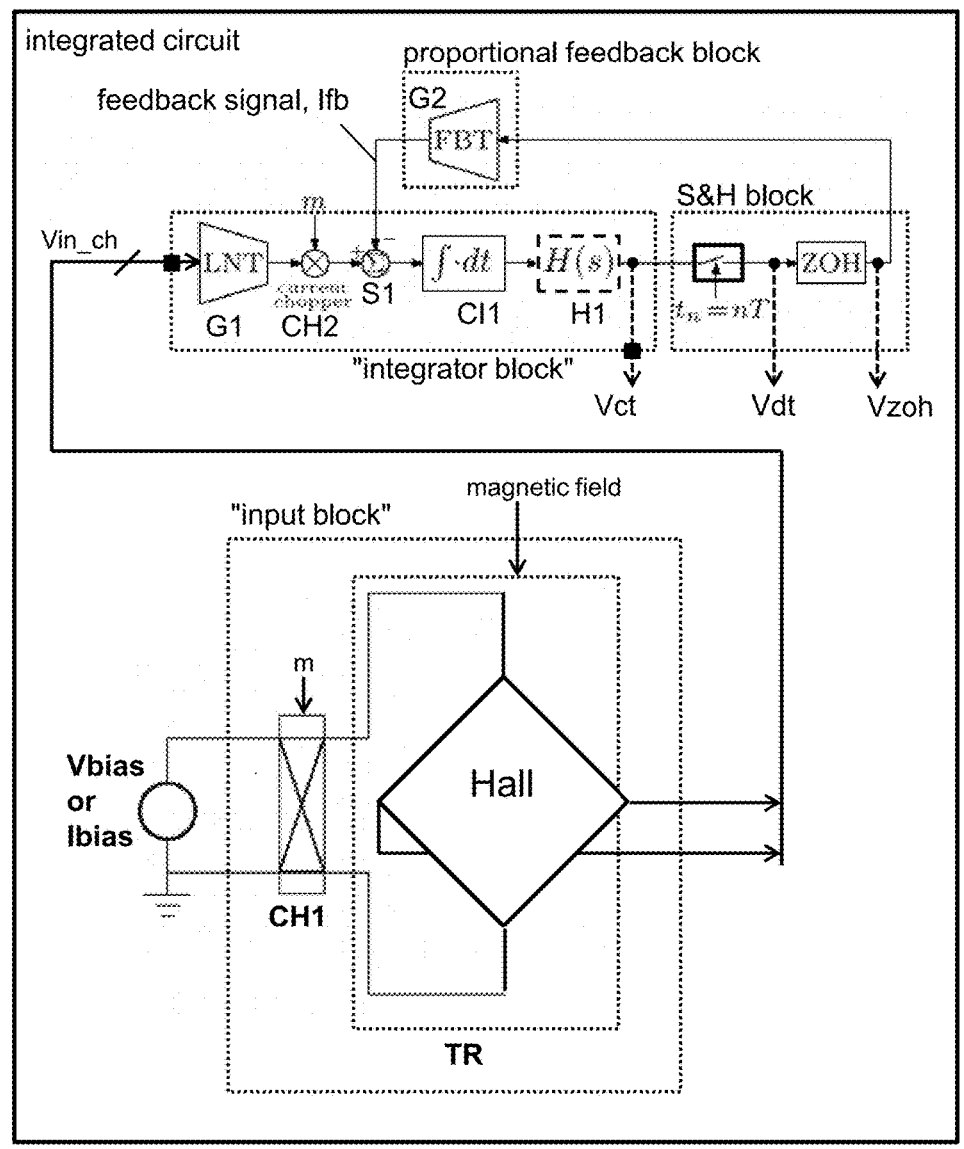

In FIG. 7, the input block contains a biasing source (here: a biasing voltage or a biasing current) and a transducer TR (here: a Hall element). Such transducers are well known in the art (e.g. as a Horizontal Hall plate, or as a Vertical Hall plate), and is capable of converting a magnetic field component (e.g. the component perpendicular to the plane of the Hall element) into an electrical signal. Similar to the embodiment of FIG. 6, the first chopper CH1 is located upstream of the transducer TR, so that the biasing source is chopped. The "voltage signal to be amplified" can be seen as the voltage signal that would be generated if the first chopper CH1 would receive a non-alternating signal m(t)=+1. The action of chopping the input signal by means of CH1 may be accompanied by a change in transducer nodes used for excitation and transducer nodes used for sensing, as is for instance the case when applying so called "spinning-current readout" techniques of one or more Hall elements. The biasing source and the first chopper CH1 and the transducer TR may be located on the same die as the components G1, CH2, CI1, S&H and G2, or the biasing source and the first chopper CH1 and the transducer may be located on a second die, different from the first die.

In another embodiment (not shown), the input block further comprises a transducer TR of the kind that converts a physical (e.g. non-electrical)signal or exitation into a voltage signal, the transducer being arranged upstream of the first chopper CH1 for providing the voltage signal Vin to be amplified in response to the physical (e.g. non-electrical) signal or excitation.

The transducer may for example comprise a piezo-electrical material adapted for generating a voltage in response to a pressure exerted upon the transducer, or the transductor may for example comprise a photovoltaic element adapted for generating a voltage signal in response to a light incident to the photovoltaic element, or an antenna adapted for converting electromagnetic energy into a voltage signal, or in general, any kind of transducer adapted for converting an energy signal into a voltage signal. Similar to what is mentioned above, the transducer may be implemented on the same die as the amplifier circuit, or may be implemented on a separate die. Variants of embodiments of FIG. 6 and FIG. 7 (not shown) may have another biasing source (e.g. current biasing) or excitation source (e.g. for applying a sinusoidal signal with a predefined frequency) connected to a transducer. The biasing source and the first chopper CH1 and the transducer TR may be located on the same die as the components G1, CH2, CI1, S&H and G2, or the biasing source and the first chopper CH1 and the transducer may be located on a second die, different from the first die.

Different First Feedback Path:

In FIG. 2, the first feedback signal is fed back to a summing element S1 located between the second chopper CH2 and the current integrator CI1. However, the invention is not limited thereto, and the feedback signal may also be fed back to other locations upstream of the current integrator CI1, as illustrated for example in FIG. 10 to FIG. 13. However, dependent on where the feedback signal is applied, the feedback path may contain a third chopper CH3 or not, and may contain a scaler or attenuator (voltage in, voltage out) or a transconductance G2 (voltage in, current out), more specifically:

If the feedback signal is applied as a voltage signal Vfb, the feedback path contains a proportional scaler. If the feedback path is applied as a current signal Ifb, the feedback path contains a transconductance G2. If the feedback signal is applied downstream of the second chopper CH2 or upstream of the first chopper CH1, a non-chopped feedback signal is to be provided. If the feedback signal is applied between the first chopper CH1 and the second chopper CH2, a chopped feedback signal is to be provided, in which case the feedback path additionally comprises a third chopper CH3, chopped at the same frequency fc as the first and second chopper CH1, CH2. Hence, it can be understood why:

- in the embodiment of FIG. 10 the first feedback signal Ifb_ch is provided as a chopped feedback current to a current summing node or current summing element S1 located between the first transconductance G1 and the second chopper CH2. The first feedback path contains a third chopper CH3 and a transconductance G2;
- in the embodiment of FIG. 11 the first feedback signal Ifb_ch is provided as a chopped feedback current to the first transconductance G1, e.g. to an internal node thereof. The first feedback path contains a third chopper CH3 and a transconductance G2;
- in the embodiment of FIG. 12 the first feedback signal Vfb is provided as a chopped voltage signal to a voltage summing element S1 located between the first chopper CH1 and the first transconductance G1. The first feedback path contains a third chopper CH3 and a scaler G2 implementing a constant scaling factor 1/A;
- in FIG. 13 the first feedback signal is provided as a non-chopped voltage signal to a voltage summing element S1 located upstream of the first chopper CH1. The first feedback path contains a scaler implementing a constant scaling factor 1/A, but does not contain a third chopper CH3.

Optional Second Feedback Path:

FIG. 14 shows a variant of the embodiment of FIG. 10, further comprising a second feedback path for reducing the effects of offset and flicker noise of the amplifier. The second feedback path comprises a third chopper CH3 for chopping an output signal of the amplifier Vct or Vdt or Vzoh, and a filter H3 downstream of the third chopper. In FIG. 10 the first feedback path already contained a third chopper, and the same chopper CH3 is also used in the second feedback path, but that is not absolutely required and a separate chopper may also be used. All choppers of the circuit are chopped at the chopping frequency fc. The filter H3 has a transfer function comprising at least one integration, and preferably having a zero at the chop frequency fc, the zero preferably originating from a lowpass Finite Impulse Response (FIR) factor, such as $(1+Z^{-1})$ when fs=2fc, as is the case for preferred embodiments of FIG. 14, but the present invention is not limited thereto.

An advantage of the second feedback path is that it may further reduce the amount of up-converted offset and flicker noise. The third chopper CH3 demodulates the up-converted noise to low frequencies, which is integrated by the filter H3, and fed back as an offset compensation signal Vfb2. Additionally, the amplifier output signal is upconverted to fc by CH3, which is largely blocked by the integration and the optional zero of H3.

In the specific embodiment shown in FIG. 14, the second feedback path provides a second feedback signal as a voltage signal Vfb2 to a summing element S2 arranged between the first chopper CH1 and the first transconductance G1, but the invention is not limited thereto, and other ways of providing the second feedback signal are possible. The second feedback signal can be provided either as a voltage or as a current. In the latter case an additional transconductance may be present. The second feedback signal can be provided to another component or node upstream of the second chopper CH2, in particular between the node that provides the chopped input signal Vin_ch and the second chopper CH2. The second feedback signal can also be provided as a chopped current to the current integrator CI1.

The following options are contemplated regarding the second feedback path:

a) no second feedback path is provided (as shown e.g. in FIG. 2 to FIG. 10);
b) the second feedback signal is provided as a voltage signal Vfb2 to a voltage summing element located between the first chopper CH1 and the first transconductance G1 (as shown e.g. in FIG. 14 and FIG. 15);
c) the second feedback signal is provided as a (voltage or current) feedback signal to an internal node of the first transconductance G1 (not shown);
d) the second feedback signal is provided as a current signal to a current summing node or current summing element located between the first transconductance G1 and the second chopper CH2 (not shown).
e) the second feedback signal is provided as a chopped current to the current integrator CI1, in which case an additional chopper is present between the output of H3 and the current integrator CI1, the additional chopper being operated at the same chopping frequency fc as CH2. (not shown).

It is pointed out that all combinations of input blocks described above (in relation to FIG. 2 to FIG. 7), and all combinations of first feedback path described above (in relation to FIG. 10 to FIG. 13), and all combinations of second feedback path described above (in relation to FIG. 14 and FIG. 15) are possible embodiments of the present invention (if sized accordingly). A non-exhaustive table (Table 1) lists specific combinations of features as embodiments of circuits according to the present invention.

TABLE 1 combination of features as embodiments of the present invention

| input block of | first feedback path of | second feedback path |
|---|---|---|
| FIG. 2 | FIG. 10 | not present |
| FIG. 3 | FIG. 10 | not present |
| FIG. 4 | FIG. 10 | not present |
| FIG. 5 | FIG. 10 | not present |
| FIG. 6 | FIG. 10 | not present |
| FIG. 7 | FIG. 10 | not present |
| FIG. 2 | FIG. 10 | between G1 and CH2 |
| FIG. 3 | FIG. 10 | between G1 and CH2 |
| FIG. 4 | FIG. 10 | between G1 and CH2 |
| FIG. 5 | FIG. 10 | between G1 and CH2 |
| FIG. 6 | FIG. 10 | between G1 and CH2 |
| FIG. 7 | FIG. 10 | between G1 and CH2 |
| FIG. 2 | FIG. 10 | between CH1 and G1 |
| FIG. 3 | FIG. 10 | between CH1 and G1 |
| FIG. 4 | FIG. 10 | between CH1 and G1 |

TABLE 1-continued combination of features as embodiments of the present invention

| input block of | first feedback path of | second feedback path |
|---|---|---|
| FIG. 5 | FIG. 10 | between CH1 and G1 |
| FIG. 6 | FIG. 10 | between CH1 and G1 |
| FIG. 7 | FIG. 10 | between CH1 and G1 |
| FIG. 2 | FIG. 10 | to internal node of G1 |
| FIG. 3 | FIG. 10 | to internal node of G1 |
| FIG. 4 | FIG. 10 | to internal node of G1 |
| FIG. 5 | FIG. 10 | to internal node of G1 |
| FIG. 6 | FIG. 10 | to internal node of G1 |
| FIG. 7 | FIG. 10 | to internal node of G1 |

Figure 11:
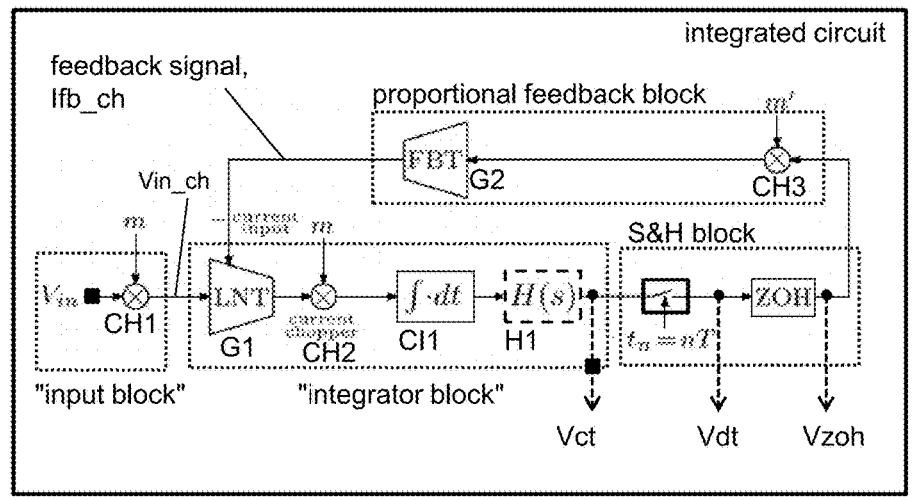

Another table Table 2, not explicitly shown, but similar to Table 1 (and with N being an integer larger than zero, preferably N=1 or N=2) can be formed, containing "FIG. 11" instead of "FIG. 10" for the first feedback path, listing another set of embodiments according to the present invention.

Figure 12:
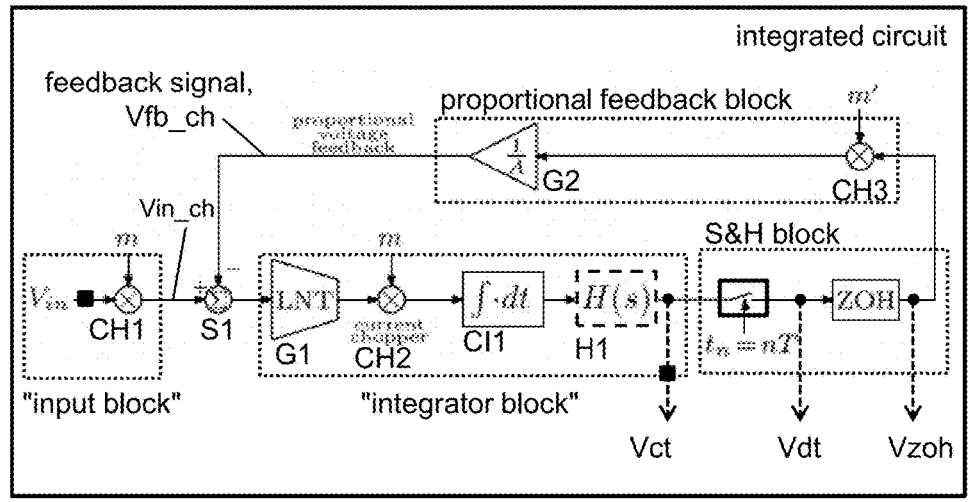

Another table Table 3, not explicitly shown, but similar to Table 1 (and with N being an integer larger than zero, preferably N=1 or N=2) can be formed, containing "FIG. 12" instead of "FIG. 10" for the first feedback path, listing another set of embodiments according to the present invention.

Figure 13:
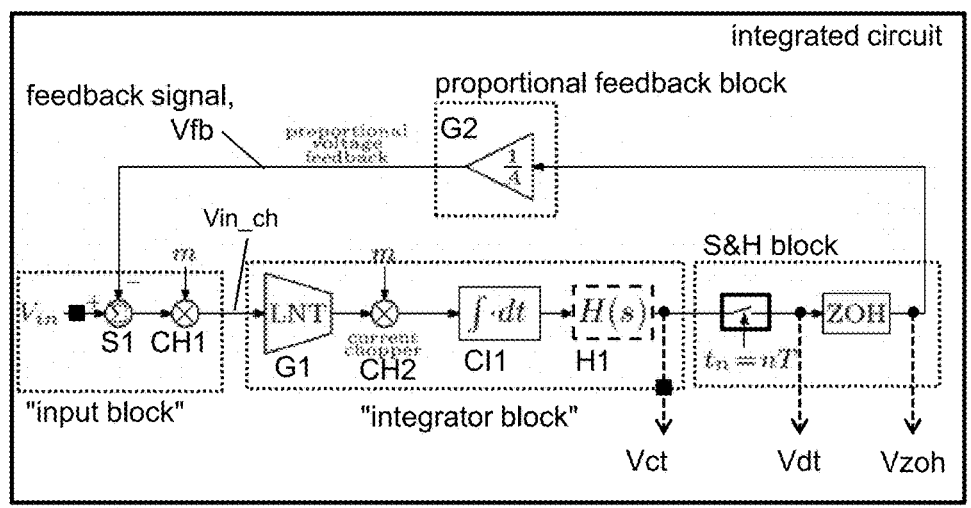

Another table Table 4, not explicitly shown, but similar to Table 1 (and with N being an integer larger than zero, preferably N=1 or N=2) can be formed, containing "FIG. 13" instead of "FIG. 10" for the first feedback path, listing another set of embodiments according to the present invention.

The attentive reader will recognize that the third chopper CH3 in the circuit of FIG. 14 is a common component of the first feedback path and of the second feedback path, but it is clear to the skilled person that it is also possible to provide a circuit with a chopper in the first feedback path, and another separate chopper in the second feedback path (i.e. as two distinct physical components).

It is also clear to the skilled person that in any of the previous embodiments which comprise a ZOH followed by a third chopper CH3, the order of these two components may be interchanged when the sample frequency fs=N·fc with N being an integer value equal to or larger than 2. In this case, the ZOH block provides a chopped output signal rather than an unchopped signal.

FIG. 15 shows a variant of FIG. 14 wherein the first feedback path contains a sample-and-hold block operated at a first sampling frequency $fs_1$ equal to an integer N larger than zero (for example N=1 or N=2) times the chopping frequency fc and a third chopper CH3, while the second feedback path contains a sampler operated at a second frequency $fs_2$ equal to twice the chopping frequency fc (i.e. $fs_2=2 \cdot fc$) and a fourth chopper CH4 operated at the chopping frequency fc and an offset feedback block having a transfer function H3 as described above. Depending on the exact implementation, the second feedback path may optionally further comprise means for delaying the chopper modulation signal m (e.g. used for CH2), the delayed modulation signal being applied to CH4.

Sizing of the Second Feedback Path

The purpose of the second feedback path is to reduce the spectral components corresponding with up-converted offset and flicker noise in the output signal(s). Since the up-converted offset and flicker noise can be refered to the input (Vin), the effect of the second feedback loop on the overall transfer from input Vin to an amplifier output is to attenuate frequencies around the chopping frequency fc and odd multiples thereof. The choice of the particular filter H3, and the sizing of its parameters affects the depth and width of the notches. An example of a suitable filter H3 has the form: $H3(z)=\alpha(1+1/z)/(z-1)$, in which $\alpha$ is a scale factor to be sized, and in which the denominator represents the integration, and the numerator the FIR factor $(1+1/z)$.

Because of the omnipresence of computing power, the task of sizing this filter may be found numerically, by means of simulation for various parameter values. But analytical techniques are also possible. The combined action of the feedback path comprising CH3, the filter $H3(z)$, and CH2 can be modeled as a transfer $H3(-z)=\alpha(1-1/z)/(z+1)$, that is the action of chopping before and after the filter H3 can be understood as implementing a frequency-transformation $(z \rightarrow -z)$ of the H3 filter. This allows to derive an equivalent system-level model of the system in FIG. 14 which does no longer contain choppers (but still contains sampling inside the loop). What remains is a sampled-data feedback system, which can be analysed and sized according to methods known in the art, e.g. from "Digital and Sampled-Data Control Systems", J. T. Tou, McGraw-Hill Book Company, Inc., 1959.

From the discussion of FIG. 14 and FIG. 15, it will be clear that each of the embodiments listed in Table 1, Table 2, Table 3 and Table 4 discussed can be implemented with:

i) the sampler of the first feedback path operated at $fs_1=2 \cdot fc$ and the same or physically different sampler of the second feedback path also operated at $fs_2=2 \cdot fc$ (as in FIG. 14), or ii) the first sampler of the first feedback path operated at $fs_1=N \cdot fc$ and the second sampler of the second feedback path operated at $fs_2=2 \cdot fc$ (as in FIG. 15), N being an integer larger than zero, for example N equal to 1, thus at least doubling the number of possible variants.

Simulation Results:

The behaviour of the circuit shown in FIG. 14 was simulated for $fs=2 \cdot fc$, but as indicated above, the invention is not limited thereto, and fs/fc can also be another integer larger than zero, for example any integer in the range from 1 to 10. In preferred embodiments of the circuits shown in FIG. 2 to FIG. 14, the ratio fs/fc is 1 or 2.

Behaviour in the Time-Domain:

FIG. 16 shows a Simulink model of the circuit of FIG. 14 as a system-level simulation model, for exemplary values of the components.

FIG. 17 shows an example of a continuous-time output signal Vct obtainable by the circuit of FIG. 14 as simulated by the high-level model of FIG. 16. This Figure illustrates in particular the effect of the second feedback loop in the presence of a DC-offset (explicitly added in the simulation model as "Hall Plate Offset", representing a DC-offset value). As can be seen, after a relatively short transient behaviour, the DC-offset is gradually canceled. During the transient behaviour, the output signal has a triangular signal superimposed on the actual amplified signal.

Behaviour in the Frequency-Domain:

At the time of making the invention, the inventors could not predict the precise impact the sample-and-hold block (sampled at fs), and the first feedback signal (as proportional feedback signal with a very specific proportionality factor) would have on the overall circuit behaviour, in particular, on its noise behaviour. In order to study the effects of noise folding within the feedback path, transfer functions where determined, and the result is shown in FIG. 18 to FIG. 21. For input frequencies above the Nyquist frequency fs/2, the output frequency no longer matches the input frequency due to fold-back. The plot indicates how much the input frequencies are attenuated (not to which frequency they fold).

FIG. 18 shows how much a (noise) signal at the input is amplified or suppressed as a function of frequency (where it needs to be understood that frequencies above the Nyquist frequency fs/2 will additionally fold into the baseband). FIG. 18 comprises three plots:

Plot 1801 shows a typical (prior art) first order transfer function of an amplifier circuit without sample-and-hold circuit and without the second feedback path (offset feedback). This transfer is shown as a first-order reference characteristic, with a DC-gain equal to $A_0$, and a 3 dB bandwidth at f/fs=0.44.

Plot 1802 is an approximate transfer function of the circuit shown in FIG. 14 without the second feedback path (i.e. the circuit shown in FIG. 10), Plot 1803 is a simulated transfer function of the circuit shown in FIG. 14 including the second feedback path (for offset feedback) for the case fs=2·fc.

The frequency-band of interest is the band from DC to the 3 dB bandwidth at $f_{BW}$=0.44 fs. The 3 dB bandwidth is close to the so called "Nyquist frequency" corresponding to f=fs/2, or f/fs=0.5. In practice, the input signal (e.g. coming from a sensor) may have higher frequencies, e.g. white noise, but these frequencies are undesired. An "ideal" amplifier would amplify the band of interest $f_{BW}$ with amplification factor $A_0$, and would block all frequencies higher than $f_{BW}$. Such an ideal amplifier does not exist in practice, and can only be approximated. One approach used in the prior art is to use a chopped amplifier with a bandwidth significantly exceeding $f_{BW}$, and add thereafter higher order continuous-time filters, e.g. a second order RC-filter or Butterworth filter or Elliptic filter or Chebychev filter. Although the design of such filters is well described in literature, their realization in integrated circuitry requires active components, such as op-amps, which leads to additional power consumption. These filters also necessarily operate in continuous-time, which often require tuning due to the large spread in component values.

The present invention however, takes a different approach, by adding a sample-and-hold block to the first feedback loop as describe above, which can easily be integrated in a semiconductor device. This results in the transfer characteristic 1802, which is somewhat higher than the reference curve in the pass-band, and has deep notches in the frequency spectrum at multiples of the sample frequency (i.e. f/fs=integer). The amplifier with the "proportional discrete-time feedback path" as proposed by the present invention thus provides an inherent filtering, which leads to far less noise folding than the first-order reference curve (when the amplified signal is sampled), because the area under the curve 1802 is much lower than the area under the curve 1801. In fact, the graph of FIG. 18 gives a wrong impression, because it shows the graphs on a logarithmic frequency scale and a logaritmic amplitude scale.

FIG. 19 shows the plots of FIG. 18 on a logarithmic frequency scale and a linear amplitude scale. The curves 1901, 1902 and 1903 of FIG. 19 correspond to the curves 1801, 1802, 1803 respectively.

FIG. 20 shows the square of the curves of FIG. 18 on a linear amplitude scale and a linear frequency scale, which gives a better impression of the noise improvement, because the accumulated noise power should be considered. The curves 2001, 2002 and 2003 of FIG. 20 correspond to the curves 1801, 1802, 1803 respectively. As can be seen, the behaviour is improved both in the pass-band (higher than the first order characteristic), as well as in the in the stop-band (much lower than the first order characteristic).

It is noted that noise folding due to sampling only occurs for frequencies above the Nyquist frequency. Therefore, unwanted signals in the frequency range from $f=f_{BW}$ to f=fs/2 can still be removed, e.g. in the digital domain or by means of switched-capacitor filters.

As discussed above, by sizing the components of the second feedback path, the frequency response of the system can be tuned. As can be seen e.g. in FIG. 20, sizing or tuning the values of the components of the second feedback loop (for offset feedback) may be used to provide good suppression, e.g. sufficient suppression for the envisioned application, around the chop frequency fc (which in FIG. 20 is located at f/fs=0.5). The effect of this second feedback loop on the inherent filtering effect is shown in plot 1803 of FIG. 18, for the case fs=2·fc, and a filter H3=(0.1/$A_0$)*(fs/s)*(1+ $Z^{-1}$). In this example, the chop frequency fc is equal to the Nyquist frequency fs/2, which is slightly beyond the useful bandwidth $f_{BW}$. The second feedback loop provides addition notches at odd multiples of the chopping frequency fc, which are exactly the positions where also the up-converted offset and flicker noise resides. The second feedback loop can moreover be tuned such that it provides additional gain near the end of the passband, the amount of which is affected by the scale factor in H3. This scale factor can be chosen to arrive at a relatively flat passband, which makes a very steep transition at the end of the "band of interest" $f_{BW}$.

Another advantage of providing the second feedback loop is that the location of the steep edge (notch at f=fs/2) is mainly or solely defined by the chopping frequency fc and sampling frequency fs, and not by component values (e.g. resistors, capacitors, inductors), which typically have much higher tolerances (e.g. more than 10% or even more than 30% on their absolute value).

In order to quantify the reduction in noise-folding, an excess factor can be defined, corresponding with the area under the curves in FIG. 20 in the noise-folding range f>fs/2 divided by the area under the same curves in the range f<fs/2 (i.e. without noise folding). It can be shown that the excess factor is 0.87 for curve 2001, 0.30 for curve 2002, and 0.28 for curve 2003, which is believed to be the lowest excess factor known in the art for circuits where the signal is sampled without intermediate analog filtering.

Sampling Frequency:

In the circuits shown in any of FIG. 2 to FIG. 7 and FIG. 10 to FIG. 13 and FIG. 15, the (first) sampling frequency fs is equal to N·fc, where N is an integer number larger than zero. In preferred embodiments N is chosen equal to 1 or 2. The second feedback loop, if present, is sampled at a second sampling frequency $fs_2$=2·fc, which is why in FIG. 14, where the sample-and-hold circuit is common for both the first and second feedback loop, is sampled at $fs_2$=2·fc.

Preferred Embodiments: fs=1·fc or fs=2·fc

The case fs=2·fc presented above (e.g. illustrated by any of the circuits shown in FIG. 2 to FIG. 7 and variants thereof, optionally combined with the second feedback loop of FIG. 14 and variants thereof) has the advantage that the chop frequency fc is relatively low, only a fraction (14%) larger than the bandwidth $f_{BW}$. This is especially interesting when the chop frequency is limited, e.g. because of a technical upper limit to the frequency at which a sensor can be chopped, or to avoid residual offset occurring from chopping artefacts.

Another interesting case is when chopping is performed at the frequency fc=fs, (e.g. illustrated by any of the circuits shown in FIG. 2 to FIG. 7 or variants thereof, combined with the second feedback loop of FIG. 15 or variants thereof). The higher chopping frequency (as compared to the case fs=2·fc) results in more suppression of up-converted noise by the integrator CI1. Furthermore, the up-converted noise is also suppressed by the inherent filtering of the system, more particularly due to the notches at integer multiples of fs which already appear in the system without the second feedback loop (see curve 1802 in FIG. 18). The second feedback loop may still be present to further suppress up-converted noise. In this case, it is particularly interesting to connect the second feedback loop (for offset feedback) to the continuous-time amplifier output Vct, and to operate the loop at $fs_2$=2·fc, since then the FIR factor $(1+Z^{-1})$ again provides a notch at the chopping frequency fc. It is noted that in this case, the sampling frequency in the second feedback loop $(fs_2)$ is twice the sampling frequency of the first feedback loop $(fs_1)$.

The solution to obtain these advantages are very simple to implement in an integrated circuit, and comes at almost no addition cost, in contrast to higher order analog filters.

Other Embodiments

Once understood, the solution (or "teaching") of the present invention can be relatively easily added to existing circuits, such as to the prior art circuit shown in FIG. 1.

FIG. 21 shows a modification of the prior-art circuit of FIG. 1, by (1) adding a sample-and-hold circuit without amplitude quantization in the feedback path, and (2) choosing a very specific proportionality factor for the proportional feedback path (as expressed by the formulas mentioned above), such that charge on the capacitor is removed in one sample period Ts=1/fs (if the input signal Vin would be zero), and (3) by choosing the sampling frequency fs equal to N·fc, where N is an integer larger than zero, for example N=1 or N=2.

Optionally a fourth chopper CH4 and a fifth chopper CH5 are added upstream and downstream of the sample-and-hold block, but these choppers CH4, CH5 are not absolutely required. When present, these choppers modulate the offset and flicker noise of the sample-and-hold block away from the band of interest. However, since the sample-and-hold block operates on large (amplified) signals, the relative contribution of its offset and flicker noise can often be tolerated. All choppers CH1 to CH3 and when present also CH4, CH5 may be operated at the same chopping frequency fc.

FIG. 22 shows a variant of the circuit of FIG. 21 (the variant including the fourth and fifth chopper), as another embodiment of the present invention, but is functionally equivalent to that of FIG. 21. Indeed, the fifth chopper CH5 and the third chopper CH3 with only a resistor divider in between is equivalent to only the resistor divider without the fifth and third chopper. It is noted that here a chopper precedes the sample-and-hold block, hence the output of the sample-and-hold block is a chopped signal (and no longer directly representative for the amplifier output signal).

Although not explicitly shown, it shall be clear to the skilled person that also in the embodiments of FIG. 21 and FIG. 22 different input blocks can be applied (as illustrated in FIG. 3 to FIG. 7), and that the input signal may be single-ended or double-ended (as illustrated in FIG. 6 to FIG. 7), and that a second feedback path can be added.

FIG. 23 to FIG. 25 show variants of the circuit of FIG. 22 having an additional second feedback loop for DC offset compensation. In FIG. 23 the second feedback signal is applied upstream of the first transconductance G1. In FIG. 24 the second feedback signal is applied to an internal node of the first transconductance G1 (as current or as a voltage signal). In FIG. 25 the second feedback signal is applied downstream of the first transconductance G1.

The operation of the circuits illustrated in FIG. 21 to FIG. 25 will not be described further herein, but the same advantages in terms of noise behavior are contemplated for these circuits.

Other Embodiment Based on Nullors

While FIG. 6 and FIG. 7 show high-level block-diagrams of circuits according to the present invention, capable of amplifying a differential signal, FIG. 26 shows an example of a practical implementation using two Operational Transconductance Amplifiers OTA1, OTA2.

Variants of this circuit (not shown) may comprise other devices that act as a "nullor". Practical implementations of nullors comprise active devices that provide gain, such as any type of transistor (MOSFET, bipolar, etc.), and whose features as a nullor emerges as the result of negative feedback being applied to an input of the nullor. It is noted that the nullator aspect of OTA1 and OTA2 is sufficient to understand how they implement at the same time the function of low-noise transconductance G1 (converting an input voltage into a current), and of the current integrator (CI1).

FIG. 26 shows a semiconductor circuit comprising:
an input block comprising a first chopper CH1 adapted for providing a differential chopped input voltage signal indicative of a differential voltage signal Vin+, Vin− to be amplified;
a first Operational Transconductance Amplifier OTA1 having a non-inverting input port "p1" connected to a first output of the first chopper CH1, the first OTA being adapted for providing a first output signal out1;
a second Operational Transconductance Amplifier OTA2 having a non-inverting input port "p2" connected to a second output of the first chopper CH1, different from the first output, the second OTA being adapted for providing a second output signal out2;
a second chopper CH2 adapted for receiving the first respectively second output signal out1, out2 from the first respectively second Operational Transconductance Amplifier OTA1, OTA2, the second chopper having a first output connected to a first node N1 and a second output connected to a second node N2;
a first integrating capacitor Cint1 arranged between the first node N1 and a third node N3;
a second integrating capacitor Cint2 arranged between the second node N2 and a fourth node N4;
a third chopper CH3 having a first input connected to the third node N3 and a second input connected to the fourth node N4 and having a first output connected to an inverting input "n1" of the first Operational Transconductance Amplifier OTA1 and having a second output connected to an inverting input "n2" of the second Operational Transconductance Amplifier OTA2;

a resistor network connected to the third, fourth, fifth and sixth node N3-N6;

a sample-and-hold circuit (S&H) having a first input in1 connected to the first node N1 and a second input in2 connected to the second node N2 and a first output out3 connected to the fifth node N5 and a second output out4 connected to the sixth node N6;

wherein a potential difference between the first and second node N1, N2 forming a continuous-time voltage signal Vct being an amplified version of the differential input signal Vin+, Vin−, a potential difference between the fifth and sixth node N5, N6 forming a zero-order-hold voltage signal Vzoh of said continuous-time voltage signal Vct;

and wherein the values of the integrating Capacitors Cint1, Cint2 and of the resistors Rfb1, Rfb2, Rin are chosen such that an amplitude ratio of the continuous-time signal Vct and the differential voltage signal to be amplified Vin is at least 2.0;

and wherein each chopper CH1, CH2, CH3 is adapted to be operated at a chopping frequency fc, and the sample-and-hold-block S&H is adapted to be operated at a sampling frequency fs, wherein the sampling frequency fs is equal to the chopping frequency fc or to an integer multiple N larger than zero thereof, such as for example once or twice the chopping frequency.

The resistor network shown in FIG. 26 comprises:

a first feedback resistor Rfb1 arranged between the third node N3 and a fifth node N5, and a second feedback resistor Rfb2 arranged between the fourth node N4 and a sixth node N6, and a third resistor Rin arranged between the third node N3 and the fourth node N4, but the invention is not limited thereto, and other resistor networks, e.g. a ladder network may also be used.

It is noted that OTA1 and OTA2 may be considered as two halves of a single differential amplifier.

This circuit functions very much the same as the circuits mentioned above, except that each nullor (e.g. an OTA) performs the role of both a transconductance G1 and a current integrator CI1. It is an advantage of this embodiment that it may require less active components as compared to embodiments described above.

FIG. 27 shows a variant of the embodiment of FIG. 26, further comprising a fourth and fifth chopper CH4, CH5, arranged upstream and downstream of the sample-and-hold circuit. An advantage of adding these choppers is that the offset and flicker noise of the sample-and-hold block is up-converted to frequencies outside the band of interest. In an alternative implementation (not shown), CH4 is not present, and instead the inputs in1, in2 of the sample-and-hold circuit are connected to out1, out2 of OTA1, OTA2.

FIG. 28 is added for better understanding how the circuit of FIG. 26 and FIG. 27 work. FIG. 28 shows a same circuit as FIG. 27, but the components are slightly rearranged, and two Op-Amps are used instead of OTA's and the resistors are renamed, and a (virtual) noise source Vn is added in the drawing for illustrative purposes only.

The working principles of this circuit are very much the same as described above, in relation to FIG. 10, FIG. 11, FIG. 12, FIG. 14 and FIG. 15, and can be summarized as follows:

an input signal Vin is applied to a first chopper CH1, the first chopper CH1 separates the useful signal band (baseband) and the noise added by the OTAs (represented by Vn), the Op-Amps or OTAs provides a current signal I_ch at its output, the magnitude of this current being such that a feedback voltage Vfb matches Vin (nullor operation)

the second chopper CH2 demodulates the current signal I_ch back to baseband, resulting in a demodulated current I_demod being applied to the integration capacitors Cint1, Cint2 this application of the demodulated current I_demod to the integration capacitors Cint1, Cint2 results in accumulation of the corresponding charge, the voltages on the integration capacitors thus providing an output of a current integration CI1 which also provides a continuous-time output voltage Vct of the amplifier a sample-and-hold circuit downstream of the second chopper CH2 samples and holds the continuous-time output voltage Vct, a feedback path provides a signal proportional to the zero-order-hold voltage Vzoh as a feedback signal to remove the charge stored on the integrating capacitors Cint1, Cint2 in a single sampling period fs (assuming a zero input signal Vin).

Also here, the sampling frequency fs is an integer multiple of the chopping frequency fc, thus fs=N·fc, where N is an integer in the range of 1 to 10, preferably N=1 or N=2. The proportional feedback path is implemented by a scaler, more in particular by a resistor divider. Although only three resistors are shown, it is clear that other resistor dividers, e.g. based on a resistor network may be used. Although not shown, it shall be clear to the skilled person that also here different input blocks can be applied (as illustrated in FIG. 3 to FIG. 7).

Other Embodiment Based on Nullors

FIG. 29 shows yet another prior art amplifier circuit. This particular circuit is known from Analog Devices for at least two decades, but it is still very popular, and this circuit and variants thereof are still considered "state of the art" (in the meaning of "best in class"). (the interested reader may search in literature for "AD620" which is a second generation version of the classic "AD5254"). The rectangle in dotted line (at the output) is used to convert the differential output signal into a single-ended output signal, which is optional and is preferably left out if the amplifier output needs to be connected to other differential circuits which may reside on the same chip.

FIG. 30 shows a classical way of how the skilled person would add choppers to the amplifier circuit of FIG. 29, for the purpose of reducing flicker noise. He would add a first chopper CH1 before the input of the amplifier circuit, and a second chopper CH2 after the output of the amplifier circuit. (The first and second chopper are shown as two separate parts for illustrative purposes only). FIG. 30 is therefore considered an obvious variant of the circuit of FIG. 29, and is not an embodiment of the present invention.

FIG. 31 shows a different modification of the prior-art circuit of FIG. 29, as an embodiment of the present invention. As can be seen by comparing FIG. 31 and FIG. 29, a first chopper CH1 is also added at the input of the amplifier circuit, but that is where the similarity with FIG. 30 ends.

Indeed, the inventors have also added a second chopper CH2, but arranged between the output of the amplifiers A1, A2 and a first (lower) terminal of the integrating capacitors C1, C2, and they added a third chopper CH3 between the other (upper) terminal of the integrating capacitors C1, C2 and the inverting inputs of the amplifiers, and they inserted a sample-and-hold circuit between the output of the amplifiers A1, A2 and the resistor network R1, R2, R3, and they specifically dimensioned the components of the feedback path such that a charge stored on the capacitors C1, C2 is removed after one sampling period TS=1/fs (assuming a zero input signal). As mentioned above, the sampling frequency fs is chosen equal to an integer multiple of the chopping frequency fc, thus:

fs=N·fc, with N being an integer larger than zero, preferably N=1 or N=2.

In other words, the semiconductor circuit 3100 comprises:

an input block comprising a first chopper CH1 adapted for receiving a differential voltage input signal in+, in− to be amplified, and for chopping said signal at a chopper frequency fc, a first output of the first chopper CH1 being connected to a gate GG1 of a first transistor T1, a second output of the first chopper CH1 being connected to a gate GG2 of a second transistor T2;

the first transistor T1 having a source SS1 connected through a first current source Ib1 to ground, and having a drain DD1 connected through a second current source Ib2 to a supply voltage vdd;

the second transistor T2 having a source SS2 connected through a third current source Ib3 to ground, and having a drain DD2 connected through a fourth current source Ib4 to a supply voltage vdd;

a first Operational Amplifier A1 and a second Operational Amplifier A2, a non-inverting input "p1" of the first Operational Amplifier A1 and a non-inverting input "p2" of the second Operational Amplifier A2 being connected to a constant or a common voltage VB;

a sample-and-hold block having a first input in1 connected to an output out1 of the first Operational Amplifier A1, and having a second input in2 connected to an output out2 of the second Operational Amplifier A2, and having a first and second output out3, out4 connected via a resistor network R1, R2, R3 to the source SS1 of the first transistor T1 and to the source SS2 of the second transistor for providing a differential feedback signal Vfb;

a second chopper CH2 having a first respectively second input connected to a first respectively second output of the first respectively second Operational Amplifier A1, A2, and having a first respectively second output connected to a first respectively second output node +OUT, −OUT, a potential difference between these nodes forming a differential output voltage Vout as a continuous-time voltage signal being an amplified version of the differential input voltage;

a first integrating capacitor C1 having one terminal connected to the first output node +OUT and another terminal connected to a first input of a third chopper CH3;

a second integrating capacitor C2 having with one terminal connected to the second output node −OUT and another terminal connected to a second input of a third chopper CH3;

the third chopper CH3 having a first output connected to the drain DD1 of the first transistor T1 and connected to the inverting input "n1" of the first Operational Amplifier A1, and having a second output connected to the drain DD2 of the second transistor T2 and connected to the inverting input "n2" of the second Operational Amplifier A2;

and wherein the values of the integrating Capacitors Cint1, Cint2 and of the resistors Rfb1, Rfb2, Rin of the resistor network are chosen such that an amplitude ratio of the differential continuous-time output signal and the differential voltage input signal Vin is at least 2.0;

and wherein each chopper is adapted to be operated at a chopping frequency fc, and the sample-and-hold-block is adapted to be operated at a sampling frequency fs, wherein the sampling frequency fs is equal to the chopping frequency fc, or an integer multiple (larger than zero) thereof.

Although not explicitly shown, it shall be clear to the skilled person that also in this circuit different input blocks can be added (as illustrated in FIG. 3 to FIG. 7). In particular, it is contemplated that the amplifier circuit of FIG. 31 can be embedded in a sensor chip further comprising a sensor element, such as e.g. a pressure sensor or temperature sensor or infrared sensor or magnetic sensor, e.g. a Hall sensor, or any other sensor.

In alternative embodiments (not shown) the first and second transistor T1, T2 may be PMOS-type MOSFETs, or bipolar transistors, or circuits that may act as a (more ideal) transistor such as Darlington-pairs, cascoded transistors, or in general a "current conveyor", e.g. a "first generation current conveyor" or a "second generation current conveyor" (i.e. a three-terminal device with terminals designated X, Y, and Z, in which the potential at X equals whatever voltage is applied to Y, and the current flowing into X is mirrored at Z with a high output impedance).

Variants of FIG. 26 to FIG. 28 and FIG. 31

The embodiments of FIG. 26 to FIG. 28 and that of FIG. 31 are very specific embodiments, and the skilled person can easily derive several variants hereof. The topology of these circuits can be formulated in more general terms as follows:

A semiconductor circuit 2600, 2700, 2800, 3100, comprising:

an input block comprising a first chopper CH1 adapted for providing a chopped input voltage signal Vin_ch indicative of a voltage signal Vin to be amplified;

at least one amplifier OTA1, OTA2; AMP1, AMP2; A1, A2, each having an inverting input port n1, n2 and a non-inverting input port p1, p2 and an output port q1, q2, and each being adapted to provide an output signal out1, out2 on its output port q1, q2 such that a voltage on its inverting input port n1, n2 is substantially equal to a voltage on its non-inverting input port p1, p2, and wherein either the output port of the first chopper CH1 is connected to the non-inverting input port p1, p2 of the amplifier (as illustrated e.g. in FIG. 26 and FIG. 28), or the non-inverting input port p1, p2 of the amplifier is connected to a biasing voltage VB and the output port of the first chopper CH1 is connected to the inverting input port n1, n2 of the at least one amplifier via at least one intermediate component, e.g. one or more transistors T1, T2 adapted for converting the chopped input voltage signal Vin_ch into a chopped current signal I1_ch, I2_ch (as illustrated e.g. in FIG. 31);

a second chopper CH2 having an input port and an output port, the input port being connected to the output port q1, q2 of the at least one amplifier;

a third chopper CH3 having an input port and an output port, the output port being connected to the inverting input port n1, n2 of the at least one amplifier;

at least one integration capacitor Cint1, Cint2; C1, C2 connected between the output port of the second chopper CH2 and the input port of the third chopper CH3;

a sample-and-hold circuit S&H having an input port in1, in2 connected to the output port q1, q2 of the amplifier or to the output port of the second chopper CH2, directly or through one or more intermediate components CH4, and having an output port out3, out4 for providing a zero order hold voltage signal Vzoh;

a proportional feedback network Rfb1, Rfb2, Rin; R1, R2, R3 having an input port connected directly or through one or more intermediate components CH5 to the output port of the sample-and-hold circuit S&H, and being adapted for providing a proportional feedback signal Vfb; Vfb; Ifb1, Ifb2, and having an output port connected directly or through one or more intermediate components CH5; T1, T2 to the inverting input port n1, n2 of the at least one amplifier;

wherein a voltage of the at least one integration capacitor provides a continuous-time voltage signal Vct being an amplified version of the voltage signal to be amplified Vin;

and wherein the values of the proportional feedback network are chosen such that an amplitude ratio of the continuous-time signal Vct and the voltage signal to be amplified Vin is at least 2.0;

and wherein the value of the at least one integration capacitor is chosen such that, for a chopped input signal Vin_ch equal to zero, a charge stored on the integrating capacitor at the beginning of a sample period Ts is linearly removed during one single sampling period Ts of the sampling signal, in such a way that the charge is completely removed at the end of the single sampling period Ts;

and wherein each chopper CH1, CH2, CH3, and also CH4, CH5 if present, is adapted to be operated at a chopping frequency fc, and the sample-and-hold-block S&H is adapted to be operated at a sampling frequency fs, wherein the sampling frequency fs is equal to the chopping frequency fc (i.e. fs=1·fc) or the sampling frequency fs is equal to an integer number (N) larger than zero times the chopping frequency fc (i.e. fs=N·fc; N>0).

Further Variants

Although only shown in FIG. 2, it is of course also contemplated that an ADC and/or a microcontroller and/or memory can also be added to the other embodiments of the present invention.

Although the invention is described primarily for a circuit with a deadbeat response equal to a single sampling period Ts=1/fs, (meaning that the charge on the capacitor at the start of a sample interval is removed after exactly one period Ts), the circuits of FIG. 2 to FIG. 15 and, in all their variants of input blocks, first feedback path and second feedback path, for example those listed in Table 1 to Table 4, can be generalized such that the block H1 (not shown in FIG. 14 and FIG. 15, but it can be readily added in the same manner as in FIG. 2) comprises at least one additional integrator arranged downstream of the first integrator CI1, and wherein one or more additional feedback paths may be present between the output of the sample-and-hold and a node upstream of each additional integrator, and wherein the components of the circuit are sized such that a charge on the capacitors of the integrators are removed after for example exactly two integration intervals. Simulations have shown that such a circuit may provide even better results than the results shown in FIG. 18 to FIG. 21. It depends on the particular application if the extra current needed for the at least one additional integrator outweighs the better performance in terms of reduced noise folding.

When in the disclosed embodiments choppers have the same chopping frequency fc, there may be differences in the phase of the modulation signals being used. Also, the signals controlling the chopper switches may be adapted to mitigate parasitic effects, such as charge injection, e.g. by introducing some zero-banding of transient spikes, but these are considered implementation details and are well known in the art of chip design.

The invention claimed is:

1. A semiconductor circuit, comprising:
an input block comprising a first chopper for providing a chopped input voltage signal indicative of a voltage signal to be amplified;
a first transconductance arranged downstream of the first chopper and adapted for receiving said chopped voltage signal and adapted for converting said chopped voltage signal into a chopped current signal;
a second chopper arranged downstream of the first transconductance adapted for providing a demodulated current signal;
a current integrator arranged downstream of the second chopper, the current integrator comprising an integrating capacitor for storing an integrated signal and being adapted for providing a continuous-time signal;
a first feedback path comprising:
a sample-and-hold block arranged downstream of the current integrator and adapted for receiving the continuous-time signal and for sampling said signal using a sampling signal thereby providing a sampled signal, and for providing a zero-order-hold voltage signal proportional to said sampled signal;
a first feedback block arranged downstream of the sample-and-hold block, the first feedback path being adapted for providing a first feedback signal proportional to the zero-order-hold signal according to a predefined proportionality factor, the first feedback signal being provided to the current integrator or upstream of the current integrator;
and wherein the semiconductor circuit is configured such that an amplitude ratio of the continuous-time signal and the voltage signal to be amplified is at least 2.0;
and wherein the first feedback block is adapted for providing the feedback signal such that, for a chopped input signal equal to zero, a charge stored on the integrating capacitor at the beginning of a sample period is linearly removed during one single sampling period of the sampling signal, in such a way that the charge is completely removed at the end of the single sampling period;
and wherein each of the first and second chopper is adapted to be operated at a chopping frequency, and the sample-and-hold-block is adapted to be operated at a sampling frequency, wherein the sampling frequency is equal to the chopping frequency or equal to an integer times the chopping frequency.

2. The semiconductor circuit according to claim 1, wherein the first feedback path is arranged in one of the following ways:
i) wherein the first feedback block comprises or is a second transconductance adapted for providing a current feedback signal which is fed back between an output of the second chopper and an input of the current integrator;
ii) wherein the feedback block comprises or consists of a scaler for providing a voltage feedback signal, and the voltage feedback signal is fed back upstream of the first chopper;

iii) wherein the feedback block comprises a second transconductance for providing a current feedback signal proportional to the zero-order-hold signal, and the current feedback signal is fed back upstream of the first chopper;
iv) wherein the feedback block comprises a third chopper and second transconductance connected in series, for providing a chopped current feedback signal, the third chopper operable at the chopping frequency, and wherein the chopped current feedback signal is fed back between an output of the first transconductance and an input of the second chopper;
v) wherein the feedback block comprises a third chopper and a second transconductance connected in series, for providing a chopped current feedback signal, the third chopper operable at the chopping frequency, and wherein the chopped current feedback signal is fed back to an internal node of the first transconductance;
vi) wherein the feedback block comprises a third chopper and a scaler connected in series for providing a chopped voltage feedback signal, the third chopper operable at the chopping frequency, and the chopped voltage feedback signal is fed back between an output of the first chopper and an input of the first transconductance.

3. The semiconductor circuit according to claim 1, wherein the sampling frequency is twice the chopping frequency.

4. The semiconductor circuit according to claim 1, wherein the sampling frequency is equal to the chopping frequency.

5. The semiconductor circuit according to claim 1, further comprising, a third chopper arranged downstream of the current integrator and operable at the chopping frequency, and further comprising: a second feedback path for removing DC-offset and flicker noise, the second feedback path being adapted for providing a second feedback signal to the current integrator or upstream of the current integrator, the second feedback path comprising:
the third chopper, and
a filter arranged downstream of the third chopper, the filter having a transfer function comprising at least one integration and a factor $(1+Z^{-1})$.

6. The semiconductor circuit according to claim 1, further comprising a second feedback path for removing DC-offset, the second feedback path being adapted for providing a second feedback signal to the current integrator or upstream of the current integrator, the second feedback path comprising:
a second sampler operable at a second sample frequency, and a fourth chopper arranged downstream of the second sampler, the fourth chopper operable at the chopping frequency, and
a filter arranged downstream of the fourth chopper, the filter having a transfer function comprising at least one integration and a factor $(1+Z^{-1})$, and
wherein the second sampling frequency is equal to twice the chopping frequency.

7. The semiconductor circuit according to claim 1, wherein the input block is further adapted for receiving the voltage signal to be amplified from one or two external pins or from a voltage source inside the integrated circuit,
or wherein the input block further comprises an impedance or transimpedance arranged upstream or downstream of the first chopper and is further adapted for receiving a continuous-time current signal from an external pin or from a current source inside the integrated circuit,
or wherein the input block further comprises a transducer of the kind that converts a physical signal or excitation into a voltage signal, the transducer being arranged upstream of the first chopper for providing the voltage signal to be amplified in response to the physical signal or excitation;
or wherein the input block further comprises a transducer of the kind that requires a biasing signal and provides a voltage signal indicative of a physical quantity, the transducer being arranged upstream of the first chopper for providing the voltage signal to be amplified in response to the physical quantity.

8. The semiconductor circuit according to claim 1, wherein at least all components downstream of the first chopper are integrated on a single semiconductor die.

9. A sensor device comprising:
at least one sensor element or at least one transducer or at least one impedance or transimpedance for providing at least one voltage signal to be amplified;
a semiconductor circuit according to claim 1, arranged for amplifying said at least one voltage signal.

10. The sensor device according to claim 9, further comprising:
an analog-to-digital convertor for converting the amplified voltage signal;
a processor for digitally processing the digitized signal.

11. The sensor device according to claim 9, wherein the at least one transducer comprises at least one Hall sensor.

12. The sensor device according to claim 9, wherein the sensor device is a position sensor device or an electronic compass.

13. A semiconductor circuit, comprising:
an input block comprising a first chopper adapted for providing a chopped input voltage signal indicative of a voltage signal to be amplified;
at least one amplifier having an inverting input port and a non-inverting input port and an output port,
and wherein either an output port of the first chopper is connected to the non-inverting input port of the at least one amplifier, or the non-inverting input port of the at least one amplifier is connected to a constant or a common voltage and the output port of the first chopper is connected to the inverting input port of the at least one amplifier via at least one intermediate component adapted for converting the chopped input voltage signal into a chopped current signal;
a second chopper having an input port and an output port, the input port being connected to the output port of the at least one amplifier;
a third chopper having an input port and an output port, the output port being connected to the inverting input port of the at least one amplifier;
at least one integration capacitor connected between the output port of the second chopper and the input port of the third chopper;
a sample-and-hold circuit connected to the output port of the at least one amplifier or to the output port of the second chopper, directly or indirectly, the sample-and-hold circuit being configured to provide a zero order hold voltage signal;
a proportional feedback network having an input port connected directly or indirectly to the output port of the sample-and-hold circuit, and being adapted for providing a proportional feedback signal, and having an output port connected directly or indirectly to the inverting input port of the at least one amplifier;

wherein a voltage of the at least one integration capacitor provides a continuous-time voltage signal being an amplified version of the voltage signal to be amplified;

and wherein the values of the proportional feedback network are chosen such that an amplitude ratio of the continuous-time signal and the voltage signal to be amplified is at least 2.0;

and wherein the value of the at least one integration capacitor is chosen such that, for a chopped input signal equal to zero, a charge stored on the integrating capacitor at the beginning of a sample period is linearly removed during one single sampling period of the sampling signal, in such a way that the charge is completely removed at the end of the single sampling period;

and wherein each chopper is adapted to be operated at a chopping frequency, and the sample-and-hold-block is adapted to be operated at a sampling frequency, wherein the sampling frequency is equal to the chopping frequency or to an integer multiple larger than zero thereof.

14. The semiconductor circuit according to claim 13, wherein:
the input block is adapted for providing a differential chopped input voltage signal indicative of a differential voltage signal to be amplified;
the at least one amplifier comprises:
a first Operational Transconductance Amplifier (OTA) connected to a first output of the first chopper, the first OTA being adapted for providing a first output signal, and
a second Operational Transconductance Amplifier connected to a second output of the first chopper, different from the first output, the second OTA being adapted for providing a second output signal;
the second chopper is adapted for receiving the first output signal and the second output signal from the first Operational Transductance Amplifier and the second Operational Transconductance Amplifier, respectively, the second chopper having a first output connected to a first node and a second output connected to a second node;
the at least one integrating capacitor comprises:
a first integrating capacitor arranged between the first node and a third node, and
a second integrating capacitor arranged between the second node and a fourth node;
the third chopper having a first input connected to the third node and a second input connected to the fourth node and having a first output connected to the first Operational Transconductance Amplifier and having a second output connected to the second Operational Transconductance Amplifier;
the semiconductor circuit further comprises a resistive feedback network that includes:
a first feedback resistor arranged between the third node and a fifth node, and
a second feedback resistor arranged between the fourth node and a sixth node, and
a third resistor arranged between the third node and the fourth node;
the sample-and-hold circuit having a first input connected to the first node and a second input connected to the second node and a first output connected to the fifth node and a second output connected to the sixth node.

15. The semiconductor circuit according to claim 13, wherein:
the input block is adapted for receiving a differential voltage input signal to be amplified, and for chopping said signal at a chopper frequency, a first output of the first chopper being connected to a base or gate of a first transistor or darlington-pair or the like, a second output of the first chopper being connected to a base or gate of a second transistor or darlington-pair or the like;
wherein the circuit further comprises a first and a second transistor or darlington-pair or the like,
the first transistor or darlington-pair or the like having an emitter or source connected to a first current source, and having a collector or drain connected to a second current source,
the second transistor or darlington-pair or the like having an emitter or source connected to a third current source, and having a collector or drain connected to a fourth current source;
the at least one amplifier comprises:
a first Operational Amplifier and a second Operational Amplifier, the first Operational Amplifier and the second Operational Amplifier being connected to a constant or common voltage;
the sample-and-hold block having a first input connected to an output of the first Operational Amplifier, and having a second input connected to an output of the second Operational Amplifier, and having a first and second output connected via a resistor network to the emittor or source of the first transistor or darlington-pair or the like and to the emittor or source of the second transistor or darlington-pair or the like for providing a differential feedback signal;
the second chopper having a first input and a second input connected to a first output and a second output of the first Operational Transconductance Amplifier and the second Operational Transconductance Amplifier, respectively, and having a first output and a second output connected to a first output node and a second output node, respectively, a potential difference between said first and second output nodes forming a differential output voltage as a continuous-time voltage signal being an amplified version of the differential input voltage;
the at least one integrating capacitor comprising:
a first integrating capacitor having one terminal connected to the first output node and another terminal connected to a first input of the third chopper;
a second integrating capacitor having one terminal connected to the second output node and another terminal connected to a second input of the third chopper;
the third chopper having a first output connected to the collector or drain of the first transistor or darlington-pair or the like and connected to the inverting input of the first Operational Transconductance Amplifier, and having a second output connected to the collector or drain of the second transistor or darlington-pair or the like and connected to the inverting input of the second Operational Transconductance Amplifier.

16. The semiconductor circuit according to claim 13, wherein the input block is further adapted for receiving the voltage signal to be amplified from one or two external pins or from a voltage source inside the integrated circuit,
or wherein the input block further comprises an impedance or transimpedance arranged upstream or downstream of the first chopper and is further adapted for receiving a continuous-time current signal from an external pin or from a current source inside the integrated circuit, or wherein the input block further comprises a transducer of the kind that converts a physical signal or excitation into a voltage signal, the transducer being arranged upstream of the first chopper for providing the voltage signal to be amplified in response to the physical signal or excitation;

or wherein the input block further comprises a transducer of the kind that requires a biasing signal and provides a voltage signal indicative of a physical quantity, the transducer being arranged upstream of the first chopper for providing the voltage signal to be amplified in response to the physical quantity.

17. The semiconductor circuit according to claim 13, wherein at least all components downstream of the first chopper are integrated on a single semiconductor die.

18. A sensor device comprising:
at least one sensor element or at least one transducer or at least one impedance or transimpedance for providing at least one voltage signal to be amplified;
a semiconductor circuit according to claim 13, arranged for amplifying said at least one voltage signal.

19. The sensor device according to claim 18, further comprising:
an analog-to-digital convertor for converting the amplified voltage signal;
a processor for digitally processing the digitized signal.

20. The sensor device according to claim 18, wherein the at least one transducer comprises at least one Hall sensor.

21. The sensor device according to claim 20, wherein the sensor device is a position sensor device or an electronic compass.

* * * * *